(12) United States Patent
Pupalaikis et al.

(10) Patent No.: US 9,325,342 B2
(45) Date of Patent: *Apr. 26, 2016

(54) HIGH BANDWIDTH OSCILLOSCOPE

(71) Applicant: Teledyne LeCroy, Inc., Thousand Oaks, CA (US)

(72) Inventors: Peter J Pupalaikis, Ramsey, NJ (US); David C Graef, Campbell Hall, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 14/045,853

(22) Filed: Oct. 4, 2013

(65) Prior Publication Data

US 2014/0028482 A1    Jan. 30, 2014

Related U.S. Application Data

(63) Continuation of application No. 13/282,552, filed on Oct. 27, 2011, now Pat. No. 8,583,390, which is a continuation of application No. 12/644,234, filed on Dec. 22, 2009, now Pat. No. 8,073,656, which is a

(51) Int. Cl.
    *G01R 19/25*    (2006.01)
    *G01R 13/02*    (2006.01)
    (Continued)

(52) U.S. Cl.
CPC ............. *H03M 1/60* (2013.01); *G01R 13/02* (2013.01); *G01R 13/0272* (2013.01); *G01R 19/25* (2013.01); *G06F 17/40* (2013.01); *G06F 19/00* (2013.01); *H03M 1/121* (2013.01)

(58) Field of Classification Search
CPC ........... G01D 7/00; G01D 9/00; G01D 21/00; G01R 13/00; G01R 13/02; G01R 13/04; G01R 19/00; G01R 19/25; G06F 11/00; G06F 11/30; G06F 11/32; G06F 11/34; G06F 15/00; G06F 15/16; G06F 17/00; G06F 17/10; G06F 17/40; G06F 19/00

USPC .......... 73/432.1, 865.8; 324/72, 76.11, 76.12, 324/76.19, 76.22, 76.23, 76.24, 76.28, 324/76.29, 76.31, 86.38, 76.39, 76.41, 324/76.42, 76.43, 76.44, 76.45, 76.46, 324/76.47, 77.11, 113; 327/1, 50, 91, 94, 327/100, 105, 107, 129; 331/1 R, 30, 31, 32, 331/37, 42, 43, 64, 135; 341/122, 123, 126, 341/155, 200; 375/224, 225, 316; 382/254, 382/260; 702/1, 57, 66, 67, 69, 70, 71, 73, 702/74, 75, 76, 85, 106, 108, 109, 110, 112, 702/124, 126, 127, 187, 189, 190, 191, 194, 702/195, 196, 197, 198; 708/100, 200, 300, 708/309, 311

See application file for complete search history.

(56) References Cited

U.S. PATENT DOCUMENTS 2,476,445 A    7/1949   Lacy
2,552,884 A    5/1951   Cannon (Continued)

FOREIGN PATENT DOCUMENTS

CA    2203156    5/1996
EP    0275136    7/1988

(Continued)

OTHER PUBLICATIONS

"12-Bit 200 kSPS Complete Sampling ADC", *Analog Devices, Inc.*, (2000),14pgs.

(Continued)

*Primary Examiner* — Edward Cosimano
(74) *Attorney, Agent, or Firm* — Gordon Kessler; Andrew Dommer

(57) ABSTRACT

A method for improving bandwidth of an oscilloscope involves, in preferred embodiments, the use of frequency up-conversion and down-conversion techniques. In an illustrative embodiment the technique involves separating an input signal into a high frequency content and a low frequency content, down-converting the high frequency content in the analog domain so that it may be processed by the oscilloscope's analog front end, digitizing the low frequency content and the down-converted high frequency content, and forming a digital representation of the received analog signal from the digitized low frequency content and high frequency content.

49 Claims, 16 Drawing Sheets

Related U.S. Application Data continuation of application No. 12/102,946, filed on Apr. 15, 2008, now Pat. No. 7,653,514, which is a continuation of application No. 11/729,606, filed on Mar. 29, 2007, now Pat. No. 7,373,281, which is a continuation of application No. 11/281,075, filed on Nov. 17, 2005, now Pat. No. 7,219,037, and a continuation-in-part of application No. 10/693,188, filed on Oct. 24, 2003, now Pat. No. 7,058,548.

(60) Provisional application No. 60/629,050, filed on Nov. 18, 2004, provisional application No. 60/656,865, filed on Feb. 25, 2005, provisional application No. 60/656,616, filed on Feb. 25, 2005, provisional application No. 60/420,937, filed on Oct. 24, 2002.

(51) Int. Cl.
| | | |
|---|---|---|
| G06F 19/00 | (2011.01) | |
| G06F 17/40 | (2006.01) | |
| H03M 1/60 | (2006.01) | |
| H03M 1/12 | (2006.01) | |

(56) References Cited

U.S. PATENT DOCUMENTS

| | | |
|---|---|---|
| 3,783,413 A | 1/1974 | Froment et al. |
| 3,891,803 A | 6/1975 | Daguet et al. |
| 3,903,484 A | 9/1975 | Testani |
| 4,181,822 A | 1/1980 | Workman |
| 4,316,282 A | 2/1982 | Macina et al. |
| 4,354,277 A | 10/1982 | Crackel et al. |
| 4,570,153 A | 2/1986 | Kobayashi et al. |
| 5,185,801 A | 2/1993 | Meyer et al. |
| 5,187,803 A | 2/1993 | Sohner et al. |
| 5,323,391 A | 6/1994 | Harrison |
| 5,392,044 A | 2/1995 | Kotzin et al. |
| 5,412,690 A | 5/1995 | Kotzin et al. |
| 5,469,219 A | 11/1995 | Mortensen |
| 5,519,342 A | 5/1996 | McEwan |
| 5,568,142 A | 10/1996 | Velazquez et al. |
| 5,602,847 A | 2/1997 | Pagano et al. |
| 5,633,811 A | 5/1997 | Canada et al. |
| 5,659,546 A | 8/1997 | Elder |
| 5,668,836 A | 9/1997 | Smith et al. |
| 5,870,699 A | 2/1999 | Canada et al. |
| 5,937,006 A | 8/1999 | Clark et al. |
| 5,937,341 A | 8/1999 | Suominen |
| 5,950,119 A | 9/1999 | McGeehan et al. |
| 5,978,742 A | 11/1999 | Pickerd |
| 6,009,130 A | 12/1999 | Lurey et al. |
| 6,081,215 A | 6/2000 | Kost et al. |
| 6,127,962 A | 10/2000 | Martinson |
| 6,147,560 A | 11/2000 | Erhage et al. |
| 6,177,893 B1 | 1/2001 | Velazquez et al. |
| 6,198,416 B1 | 3/2001 | Velazquez |
| 6,240,150 B1 | 5/2001 | Darveau et al. |
| 6,242,899 B1 | 6/2001 | Miller |
| 6,271,773 B1 | 8/2001 | Kobayashi |
| 6,321,075 B1 | 11/2001 | Butterfield |
| 6,340,883 B1 | 1/2002 | Nara et al. |
| 6,344,810 B2 | 2/2002 | Velazquez |
| 6,380,879 B2 | 4/2002 | Kober et al. |
| 6,388,594 B1 | 5/2002 | Velazquez et al. |
| 6,424,275 B1 | 7/2002 | Velazquez et al. |
| 6,473,013 B1 | 10/2002 | Velazquez et al. |
| 6,512,481 B1 | 1/2003 | Velazquez et al. |
| 6,542,914 B1 | 4/2003 | Pupalaikis |
| 6,567,030 B1 | 5/2003 | Pupalaikis |
| 6,570,514 B1 | 5/2003 | Velazquez |
| 6,593,880 B2 | 7/2003 | Velazquez et al. |
| 6,650,180 B2 | 11/2003 | Lautzenhiser et al. |
| 6,701,335 B2 | 3/2004 | Pupalaikis |
| 6,731,922 B1 | 5/2004 | Strutz et al. |
| 6,766,178 B1 | 7/2004 | Damgaard et al. |
| 6,819,279 B2 | 11/2004 | Pupalaikis |
| 6,888,888 B1 | 5/2005 | Tu et al. |
| 6,975,685 B1 | 12/2005 | Merriam, Jr. |
| 7,039,119 B2 | 5/2006 | Friedman |
| 7,050,918 B2 | 5/2006 | Pupalaikis et al. |
| 7,058,548 B2 | 6/2006 | Pupalaikis et al. |
| 7,092,475 B1 | 8/2006 | Huard |
| 7,139,684 B2 | 11/2006 | Pupalaikis et al. |
| 7,152,008 B2 | 12/2006 | Zumkehr et al. |
| 7,219,037 B2 | 5/2007 | Pupalaikis et al. |
| 7,222,055 B2 | 5/2007 | Pupalaikis et al. |
| 7,295,826 B1 | 11/2007 | Cook et al. |
| 7,304,597 B1 | 12/2007 | LaMarche |
| 7,333,582 B2 | 2/2008 | Yoshikawa et al. |
| 7,373,281 B2 | 5/2008 | Pupalaikis et al. |
| 7,386,409 B2 | 6/2008 | Mueller et al. |
| 7,653,514 B2 | 1/2010 | Pupalaikis et al. |
| 7,782,235 B1 | 8/2010 | Velazquez |
| 7,940,198 B1 | 5/2011 | Velazquez |
| 8,073,656 B2 | 12/2011 | Pupalaikis et al. |
| 8,085,175 B2 | 12/2011 | Velazquez |
| 8,583,390 B2 * | 11/2013 | Pupalaikis et al. ............ 702/66 |
| 2002/0150173 A1 | 10/2002 | Buda |
| 2002/0181614 A1 | 12/2002 | Mostafa et al. |
| 2003/0112825 A1 | 6/2003 | Wang et al. |
| 2004/0041599 A1 | 3/2004 | Murphy et al. |
| 2004/0128076 A1 | 7/2004 | Pupalaikis et al. |
| 2004/0162691 A1 | 8/2004 | Pupalaikis et al. |
| 2004/0246047 A1 | 12/2004 | Manku et al. |
| 2004/0252044 A1 | 12/2004 | Mathis et al. |
| 2005/0089086 A1 | 4/2005 | Hwang et al. |
| 2005/0122885 A1 | 6/2005 | Kanaoka |
| 2005/0273482 A1 | 12/2005 | Moore |
| 2006/0080065 A1 | 4/2006 | Pupalaikis et al. |
| 2006/0247870 A1 | 11/2006 | Pickerd |
| 2006/0267811 A1 | 11/2006 | Tan |
| 2007/0185669 A1 | 8/2007 | Pupalaikis et al. |
| 2007/0273567 A1 | 11/2007 | LaMarche |
| 2008/0258957 A1 | 10/2008 | Pupalaikis et al. |
| 2010/0244811 A1 | 9/2010 | Pupalaikis et al. |
| 2012/0041720 A1 * | 2/2012 | Pupalaikis et al. ............ 702/189 |

FOREIGN PATENT DOCUMENTS

| | | |
|---|---|---|
| EP | 0589594 | 3/1994 |
| JP | 06197019 | 7/1994 |
| WO | WO-96/13097 | 5/1996 |
| WO | WO-2004038432 | 5/2004 |
| WO | WO-2006055935 | 5/2006 |

OTHER PUBLICATIONS

"12-Bit 400 kSPS A/D Converter", *Analog Devices, Inc.*, (2003),1-28.

"A matter of time: Today's RF signals call for a different kind of spectrum analysis", *Tektronix, Inc*, (2000),1-8.

"Advanced transmission library: Optional block function library for hypersignal block diagram/ride", *Hyperception, Inc*, (1997),1-2.

"Agilent E5052A signal source analyzer 10MHz to 7GHz", *Agilent Technologies*, (Jun. 9, 2004), 1, 6, 7.

"Digital and Analog Signal Processing Technologies: Beyond State-of-the Art", *V. Corp Technologies, Inc.*, San Diego, CA, . [Retrieved on Apr. 16, 2012]. Retrieved from the Internet <URL: www.virtualacquisitionshowcase.com/document/1585/brochure>,1-9.

"Digital Signal Processing Applications Using the ADSP-2100 Family", *Analog Devices Prentice Hall*, (1990),458-461.

"Electronics engineers' handbook", (1975),8 pages.

"Genesys, 2004 RF Microwave Design Software—Simulation", *Eagleware Corporation*, (2004),108-110.

"Intel Integrated Performance Primitives for Intel Architecture", *Reference Manual vol. 1: signal processing*, Intel Corporation,(2000),1-1242.

"R3681 Signal analyzer", *Advantest*, (2004),1-2.

"Real-time spectrum analysis tools aid transition to third-generation wireless technology", *Tektronix, Inc*, (1999),1-6.

(56) References Cited

OTHER PUBLICATIONS

"Sampling and reconstruction of periodic signals", dsp-fpga.com, (Oct. 15, 2004),1-15.
"Signature—high performance signal analyzer 100Hz to 8GHz", *Anritsu*, (2000),1-2.
"USPTO Office Action dated Apr. 24, 2009 which issued in U.S. Appl. No. 12/102,946, entitled: High Bandwidth Oscilloscope which was filed on Apr. 15, 2008.", (Apr. 24, 2009),1-12.
"Weighted Least Squares", *Engineering Statistics Handbook Section 4.1.4.3*, (Dec. 11, 2007),1-2.
Adam, Stephen F., "Microwave Theory and Applications", *Prentice Hall*, (1969),490-500.
Apolinario, Jr, J.A. et al., "On perfect reconstruction in critically sampled frequency-domain scrambler", (Sep. 1997),1-4.
Ding, G et al., "Frequency-interleaving technique for high-speed A/D conversion", *IEEE*, (2003),I857-I860.
"Putting undersampling to work", *Pentek, Inc*, (Mar. 9, 2004), 1-2.
Hoyos, Sebastian et al., "Analog to digital conversion of ultra-wideband signals in orthogonal spaces", *IEEE*, (2003),47-51.
Johannson, Hakan et al., "Reconstruction of Nonuniformly sampled bandlimited signals by means of digital fractional delay filters", IEEE Transactions on signal processing vol. 50 No. 11,(Nov. 2002),2757-2767.
Jong, M T "Methods of Discrete Signal and Systems Analysis", *McGraw-Hill Book Company*, (1982),369-373.
Lee, Hyung-Jin et al., "Frequency domain approach for CMOS ultra-wideband radios", *Proceedings for the IEEE computer society annual symposium on VLSI*, (2003),1-2.
Looney, et al., "Designing Military Data-Conversion Systems Involves Multiple Tradeoffs", Looney, Mark and Steve Reine, *Defense Electronics*, (Aug. 2004),1-5.
Luo, Xiliang et al., "Real-time speech frequency scrambling and descrambling", (Apr. 2002),1-17.
Lyons, Richard G., "Understanding digital signal processing", *Prentice Hall professional technical reference, second edition*, (2004),30-39, 346-360, 471-479, 571-572.
Mueller, James et al., "Method and apparatus for spurious tone reduction in systems of mismatched interleaved digitizers", U.S. Appl. No. 60/656,616, filed Feb. 25, 2005.
Mueller, James J., et al., "Method and Apparatus for Artifact Signal Reduction in Systems of Mismateched Interleaved Digitizers", U.S. Appl. No. 11/280,493, filed Nov. 16, 2005.
Nealen, Andrew "An As-Short-As-Possible Introduction to the Least Squares, Weighted Least Squares and Moving Least Squares Methods for Scattered Data Approximation and Interpolation", *Discrete Geometric Modeling Group TU Darmstadt*, Retrieved from the Internet <URL: http://www.nealen.net/prof.htm>.,(May 2004),1-3.
Paquelet, Stephanie et al., "RF front-end considerations for SDR Ultra-wideband communications systems", *RF Design*, (Jul. 2004),44-51.
Peckham, Matt "The Collapse of Moore's Law: Physicist Says It's Already Happening", *Time Techland* [Retrieved Aug. 13, 2012]. Retrieved from the internet<URL:http://techland.time.com/2012/05/01/the-collapse-of-moores-law-phsicist-says-its-already-happening/>, (May 1, 2012),1-6.

Petraglia, Antonio et al., "Design of magnitude preserving analog-to-digital converter", *IEICE Trans, Fundamentals*, vol. E76-A, No. 2, (Feb. 2, 1993),149-155.
Petraglia, Antonio et al., "High speed A/D conversion using QMF banks", *Center of Information Processing and Research Department of electrical and Computer Engineering* University of California Santa Barbara, CA 93106, IEEE,(1990),1-4.
Petraglia, Antonio et al., "High-speed A/D conversion incorporating a QMF bank", *IEEE Transactions on Instrumentation and Measurement*, vol. 41, No. 3, (Jun. 1992), 427-431.
Petraglia, Antonio et al., "QMF-based A/D converters:overview and new results", *International Conference on Analogue to Digital and Digital to Analogue Conversion*, Sep. 1991. Federal University of Rio de Janeiro, Brazil., (Sep. 1991),112-117.
Pupalaikis, Peter et al., "High Bandwidth Oscilloscope", National Stage patent ZL200580044244.9 Office Action dated Jun. 20, 2008, issued by the People's Republic of China, (Jun. 20, 2008),1-22.
Pupalaikis, Peter J., "An 18GHz Bandwidth, 60 GS/s Sample Rate Real-Time Waveform Digitizing System", *IEEE/MTT-S International Microwave Symposium LeCroy Corporation*, Chestnut Ridge, NY, (Jun. 2007),1-4.
Pupalaikis, Peter J., "Bilinear Transformation Made Easy", *ICSPAT 2000 Proceedings, CMP Publications*, (2000),1-5.
Pupalaikis, Peter J., et al., "High Bandwidth Real-Time Oscilloscope", USPTO issued Ex Parte Reexamination Certificate for reexamination request No. 90/012,112, U.S. Pat. No. 7,058,548, Certificate issued: Oct. 5, 2012,1-3.
Pupalaikis, Peter J., et al., "High Bandwidth Real-Time Oscilloscope", USPTO issued Ex Parte Reexamination Certificate for reexamination request No. 90/012,111, U.S. Pat. No. 7,222,055, Certificate issued: Oct. 3, 2012,1-2.
Pupalaikis, Peter J., et al., "Method of Crossover Region Phase Correction when Summing Multiple Frequency Bands", U.S. Appl. No. 11/280,671, filed Nov. 16, 2005,1-31.
Smith, Julius O., "MUS420/EE367A Lecture 4A, Interpolated Delay Lines, Ideal Bandlimited Interpolation, and Fractional Delay Filter Design", Stanford University, (Dec. 28, 2005),1-50.
Velazquez, Scott R., "A Hybrid Quadrature Mirror Filter Bank Approach to Analog-to-Digital Conversion", *MIT*, (May 1994),168pgs.
Velazquez, Scott R., "High-performance advanced filter bank analog-to-digital converter for universal RF receivers", *V Company, IEEE*, (1998),229-232.
Velazquez, Scott R., "Hybrid Filter Banks for Analog/Digital Conversion", *Thesis MIT*, (Jun. 1997),291pps.
Velazquez, Scott R., et al., "A Hybrid Filter Bank Approach to Analog-to-Digital Conversion", *MIT Lincoln Laboratory*,Lexington, MA, (1994),1-4.
Velazquez, Scott R., et al., "Design of hybrid filter banks for analog/digital conversion", *IEEE transactions on signal processing* vol. 46, No. 4, (Apr. 4, 1998),956-967.
Young, Simon "The Risk/Reward Realities of Chip Development", *TechOnLine Publication* [retrieved on Aug. 13, 2012]. Retrieved from internet<URL:http://www.eetimes.com/General/PrintView/4017925>, (Nov. 7, 2002),1-4.

\* cited by examiner

Figure 10

- - - - LF Response
· · · · · HF Response
——— Combined Response

HIGH BANDWIDTH OSCILLOSCOPE

CROSS-REFERENCE TO RELATED APPLICATIONS

This application is a continuation of U.S. patent application Ser. No. 13/282,552 filed Oct. 27, 2011, entitled "HIGH BANDWIDTH OSCILLOSCOPE FOR DIGITIZING AN ANALOG SIGNAL HAVING A BANDWIDTH GREATER THAN THE DIGITIZING COMPONENTS OF THE OSCILLOSCOPE", now U.S. Pat. No. 8,586,390, which is a continuation of U.S. patent application Ser. No. 12/644,234 filed Dec. 22, 2009 by Peter Pupalaikis et al., entitled "HIGH BANDWIDTH OSCILLOSCOPE FOR DIGITIZING AN ANALOG SIGNAL HAVING A BANDWIDTH GREATER THAN THE BANDWIDTH OF DIGITIZING COMPONENTS OF THE OSCILLOSCOPE", now U.S. Pat. No. 8,073,656, which is a continuation of U.S. patent application Ser. No. 12/102,946, filed Apr. 15, 2008 by Peter Pupalaikis et al., entitled "HIGH BANDWIDTH OSCILLOSCOPE FOR DIGITIZING AN ANALOG SIGNAL HAVING A BANDWIDTH GREATER THAN THE BANDWIDTH OF DIGITIZING COMPONENTS OF THE OSCILLOSCOPE", now U.S. Pat. No. 7,653,514, which is a continuation of U.S. patent application Ser. No. 11/729,606, filed Mar. 29, 2007 by Peter Pupalaikis et al., entitled "High Bandwidth Oscilloscope", now U.S. Pat. No. 7,373,281, which in turn is a continuation application of U.S. patent application Ser. No. 11/281,075, filed Nov. 17, 2005 by Peter Pupalaikis et al., entitled "High Bandwidth Oscilloscope", now U.S. Pat. No. 7,219,037. The '037 patent in turn claims the benefit of i) U.S. Provisional Pat. Application 60/629,050, filed Nov. 18, 2004 by Pupalaikis and entitled "High Bandwidth Oscilloscope," ii) U.S. Provisional Pat. Application 60/656,865, filed Feb. 25, 2005 by Pupalaikis et al. and entitled "The Digital Heterodyning Oscilloscope," and iii) U.S. Provisional Pat. Application 60/656,616, filed Feb. 25, 2005 by Mueller et al. and entitled "Method and Apparatus for Spurious Tone Reduction in Systems of Mismatched Interleaved Digitizers." The '037 patent is also a continuation-in-part of U.S. patent application Ser. No. 10/693,188, filed Oct. 24, 2003 by Pupalaikis et al. and entitled "High Bandwidth Real Time Oscilloscope," now U.S. Pat. No. 7,058,548, which claims the benefit of U.S. Provisional Pat. Application 60/420,937, filed Oct. 24, 2002 by Pupalaikis et al. and entitled "High Bandwidth Real Time Oscilloscope."

TECHNICAL BACKGROUND

A digital oscilloscope is a tool utilized by engineers to view signals in electronic circuitry. As circuits and signals get ever faster, it is beneficial to have digital oscilloscopes that can digitize, display and analyze these faster signals. The capability of a digital oscilloscope to digitize fast signals may be measured by its bandwidth and sample rate. The sample rate is the number of sample points taken of a waveform in a given amount of time and is inversely proportional to the sample period—the time between samples. If a sinusoidal frequency sweep is performed from DC up to higher frequencies, the bandwidth is the frequency at which the signal displayed on the digital oscilloscope screen is approximately 30% smaller than the input sine wave.

Since one of the uses of the digital oscilloscope is to design and analyze new electronic devices, high end digital oscilloscopes generally operate at speeds much higher than the present state of the art in electronics. These speeds may be achieved through the use of ever-faster sampling chips or the use of alternate methodologies to provide the desired bandwidth.

One such method involves triggering repeatedly on a periodic event. If an event is periodically repeating data obtained from multiple trigger events can be assembled together to provide a good view of the waveform. More particularly, the scope may repeatedly trigger on an event and acquire only a few points of the waveform (sometimes only one point of the waveform) on each trigger event. Scopes having this functionality are sometimes called "sampling scopes." After repeated triggers, the points are reassembled according to the sampling algorithm to create a higher "effective" sample rate version of the waveform. Furthermore, the repeated trigger events permit averaging, which can be utilized to increase the signal-to-noise ratio (SNR) and therefore enable further bandwidth increases. However, such a sampling scope presupposes a repetitive input signal so that the representation of the waveform can be generated over many triggers.

This technique may be unsuitable where the signal that is to be analyzed is not repetitive. For instance, the user of the oscilloscope may want to capture a non-repetitive event such as the cause of some failure in an electronic system. The trigger event may happen repeatedly but the signal around the trigger event may be different. Therefore, it is desirable to achieve a high bandwidth and sample rate with only a single trigger event. Such digital oscilloscopes are sometimes called real-time scopes, and acquisitions taken utilizing only a single trigger event are called single-shot acquisitions.

In real-time digital oscilloscope design the required sample rate of the sampling system is a function of the bandwidth of the analog signal to be acquired. In order to accurately represent the signal the sample rate of the sampling system should be at least twice that of the highest frequency being digitized. This is often called the "Nyquist rate."

One method for improving sample rate is time interleaving. This method utilizes multiple digitizing elements that sample the same waveform at different points in time such that the waveform resulting from combining the waveforms acquired on these multiple digitizers forms a high sample rate acquisition. For example, in a system having a two analog-to-digital converters, or ADCs, the first ADC samples the signal, then the second ADC samples the signal, then the first and so on. The digital output of the ADCs may then be multiplexed or otherwise combined to yield a composite digital corresponding to the analog input signal. Use of interleaving accordingly eases the speed requirements of each of the individual ADCs.

Use of interleaving in digital oscilloscopes may accordingly provide the significant advantage of increasing the effective bandwidth of the oscilloscope. With a given set of ADCs, a substantially higher sample rate may be achieved with the use of interleaving. Increasing the sample rate correspondingly increases the maximum frequency that may be sampled by the system, which is commonly called the "bandwidth" of the oscilloscope. The term bandwidth actually refers to a frequency range rather than an upper limit. The lower end of the range is generally understood to be mound 0 Hz for an oscilloscope, so the nominal bandwidth of an oscilloscope generally corresponds to the maximum frequency that can be sampled by the system. Thus, a two-fold increase in sample rate can provide around a two-fold increase in oscilloscope bandwidth.

Where interleaving is employed the timing relationship, gain, and offset of each digitizing element is usually matched. When digitizers are mismatched in these characteristics the accuracy of the digitized waveform is compromised.

One symptom of mismatched digitizers is error signal generation. A specific type of error signal is an artifact signal created by errors in the interleaving process. One common artifact signal is a spurious tone. When multiple digitizers work in an interleaved configuration to digitize a waveform and a single tone is applied to the system, multiple tones result. The frequency location of the spurious tones is determined by the input frequency and the number of digitizers employed. The magnitude and phase of the spurious tones is determined by the input frequency magnitude and phase, as well as the response characteristics of the individual digitizers, including the response characteristics of the various signal paths leading to each digitizing element. These spurious tones serve to degrade the quality of the digitizing system, as measured with the aforementioned specifications.

These and other design issues impose practical restrictions on the degree or order of interleaving used in digital oscilloscopes. Further improvement of bandwidth in digital oscilloscopes has generally been accomplished by design and use of faster front-end amplifiers and ADCs. The performance of the amplifiers and samplers, however, is generally limited by the state of the art in integrated circuit fabrication.

SUMMARY

A method for improving bandwidth of an oscilloscope involves, in preferred embodiments, use of frequency up-conversion and down-conversion techniques to achieve a system bandwidth that significantly exceeds the bandwidth attainable through interleaving alone. In an illustrative embodiment the technique involves separating an input signal into a high frequency content and a low frequency content, down-converting the high frequency content in the analog domain so that it may be processed by the oscilloscope's analog front end, digitizing the low frequency content and the down-converted high frequency content, and forming a digital representation of the received analog signal from the digitized low frequency content and high frequency content. The digital representation is formed in various implementations by up-converting the content to its original frequency band and then recombining the high frequency content with the low frequency content. In preferred implementations this is achieved by passing the high frequency content through a high pass filter, mixing that content with a sinusoidal waveform to generate higher and lower frequency images, substantially eliminating the higher frequency image with a low pass filter, digitizing and upsampling the lower frequency image, mixing the digitized and upsampled content with a periodic waveform having substantially the same frequency as the sinusoidal waveform to generate higher and lower frequency images, and then combining the higher frequency image with the low frequency content to form a digital representation of the original input waveform. In this manner preferred embodiments achieve the significant advantage that bandwidth may be enhanced beyond the limits associated with interleaving and the state of the art in amplifier and ADC design.

Also disclosed herein is an artifact signal correction system that in preferred embodiments is used to compensate for error tones generated during interleaving. The artifact signal correction system may include a mixing component to generate a waveform corresponding to an artifact such as an error tone, whereupon that waveform may be combined with the input waveform to substantially eliminate the artifact. In one embodiment, an input waveform and a periodic digital waveform are fed into a mixer to generate a mixed waveform with substantially the same frequency content as the input waveform except that the frequency is reversed and the phase content is negative. The periodic digital waveform may be synchronized to the digitizing elements such that the waveform has a positive magnitude during portions of the waveform sampled by a first digitizing element and a negative magnitude during portions of the waveform sampled by a second digitizing element. The mixed waveform may then be input to a digital filter that converts the phase and amplitude of the error tone to substantially the same phase and amplitude of the corresponding tones in input waveform. The converted and mixed waveform may then be synchronized with the input waveform by applying a delay to the input waveform that accommodates the aforementioned mixing and converting operations. An inverted version of the mixed waveform may then be added to the input waveform so as to substantially reduce or eliminate the error tones.

Phase differences between multiple frequency bands may be accommodated in preferred embodiments by providing a signal processing system that compensates for the relative phase difference so that the combination of the bands is constructive throughout a substantial portion of a band overlap or crossover region. In one embodiment, a signal combining system may include a comparator for determining a relative phase difference between the two signals within a predefined crossover region, a phase adjusting element for adjusting a phase of one of the two signals, and a combiner for combining the phase-adjusted signal with the other of the two signals. In another aspect, a method for adjusting a phase relationship between signals from multiple frequency bands that are being summed may include filtering a first of the signals by applying an integer samples delay, a fractional sample delay filter, and an allpass filter bank; and summing the filtered first signal with a second signal.

The details of various additional features are set forth in the accompanying drawings and the description below. Other aspects and advantages will become apparent from the description, the drawings, and the claims.

BRIEF DESCRIPTION OF DRAWINGS

For a more complete understanding of the preferred embodiments, reference is made to the following description and accompanying drawings, in which:

FIG. 10 is a representation of a configuration menu;

Like reference numbers and designations in the various drawings indicate like elements.

DETAILED DESCRIPTION OF THE PREFERRED EMBODIMENTS

The following description details certain operational and structural aspects of various preferred implementations and discusses related design considerations. These implementation details are intended to be illustrative and not limiting. Unless expressly stated otherwise, it should be understood that the components and design approaches described below may be modified to suit other particular applications.

Figure 1:
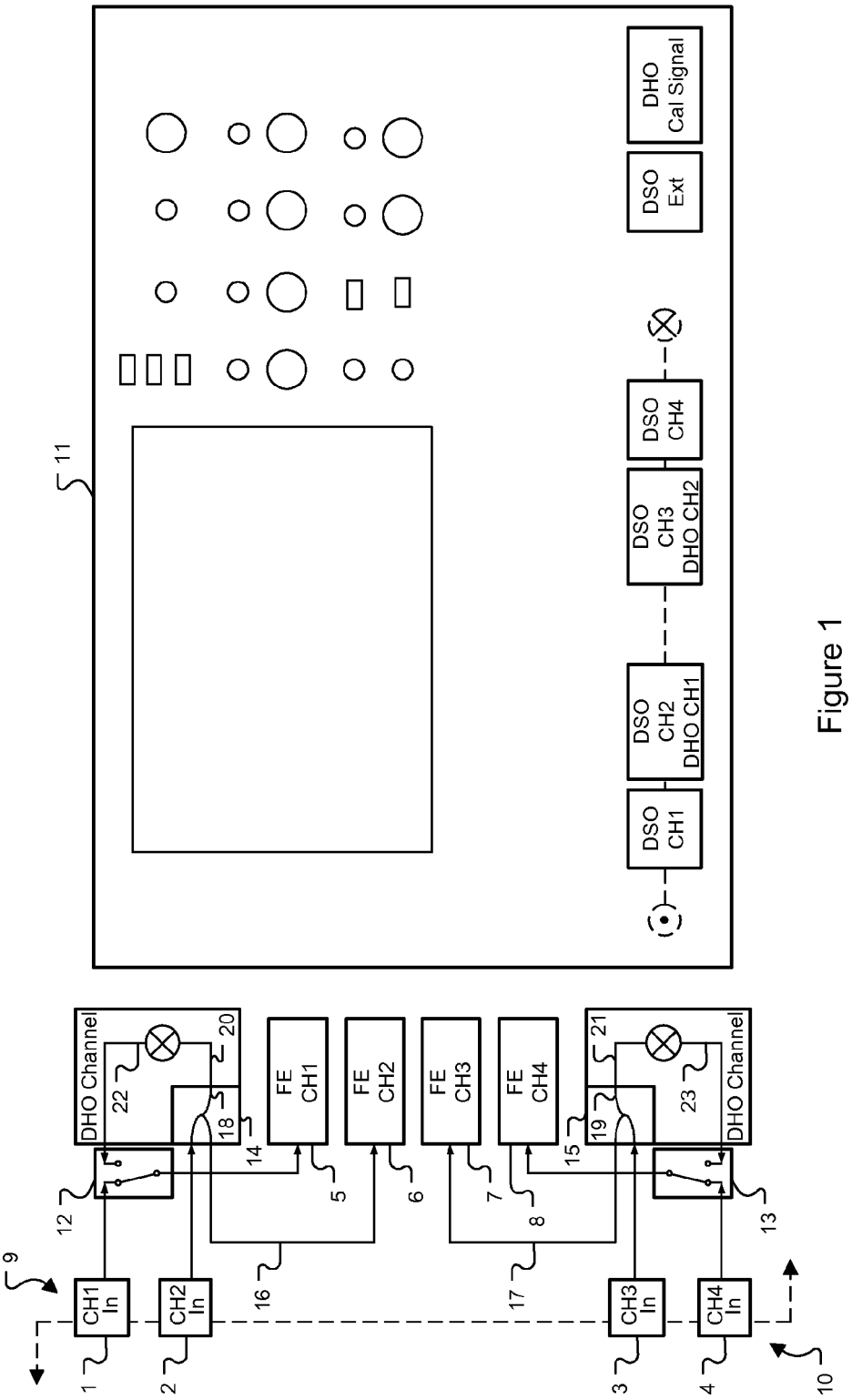
FIG. 1 is a schematic representation of an oscilloscope.

FIG. 1 shows a digital oscilloscope [11] having four input channels CH1 [1], CH2 [2], CH3 [3], and CH4 [4] connected to the inputs of each of four front-ends [5] [6] [7] [8]. In accordance with the embodiments described herein, the oscilloscope [11] may be configured to digitize waveforms at sample rates of up to 20 GS/s at bandwidths up to 6 GHz into memories up to 50 Mpoints long. Channels 1 [1] and 2 [2] are grouped together into a channel 1/2 grouping [9] and channels 3 [3] and 4 [4] are grouped together in a channel 3/4 grouping [10]. In the channel 1/2 grouping [9], the channel 1 input [1] is connected to an RF relay [12] and the channel 2 input [2] is connected to a diplexer [14]. The low frequency band (DC-6 GHz) diplexer output [16] in the channel 1/2 grouping [9] is connected to oscilloscope front-end 2 [6]. Similarly, for the channel 3/4 grouping [10] the low frequency diplexer output [17] is connected to front-end 3 [7]. In the normal relay setting, the channel 1/2 grouping [9] RF relay [12] connects the input channel 1 [1] to oscilloscope front end 1 [5] and the channel 3/4 grouping [10] RF relay [13] connects the input channel 4 [4] to the oscilloscope front-end 4 [8].

In a high bandwidth mode of operation, the oscilloscope channel 2 [2] utilized for the low frequency band continues to deliver the frequency band of the input signal from DC to 6 GHz from the diplexer output [16] to oscilloscope front-end 2 [6] and oscilloscope channel 3 [3] delivers the diplexer output [17] to front-end 3 [7]. In this mode, however, the high frequency band (from 6 to 11 GHz) output from the diplexer [18] enters the channel [20] (depicted simply as a mixer symbol). The channel serves to translate this frequency band down to 500 MHz to 5.5 GHz. This translated output at the channel output [22] is connected to the RF relay [12] which connects this signal to oscilloscope front-end 1 [5], Similarly, the high frequency band output from the diplexer [15] high frequency band output [19] enters a channel [21] and its output [23] is connected to oscilloscope front-end 4 [8] through RF relay [13]. In this manner, oscilloscope front-ends 1 [5] and 2 [6] are receiving two frequency bands. The band received by oscilloscope front-end 1 [5] is designated as the HF band because it is receiving the high frequency content of the signal applied to the channel 2 input [2]. The band received by oscilloscope front-end 2 [6] is designated as the LF band because it is receiving the low frequency content of the signal applied to the channel 2 input [2]. Similarly, oscilloscope front-ends 3 [7] and 4 [8] are receiving the LF and HF bands, respectively, of the signal applied to the channel 3 input [3].

The oscilloscope acquires the LF and HF frequency bands simultaneously and during waveform processing, translates the HF band back to its proper location at 6 to 11 GHz, after which the LF and HF bands are recombined forming an 11 GHz bandwidth acquisition. The result of this processing is two waveforms, one produced from the channel 2 input [2] and the other from the channel 3 input [3]. Channel inputs 1 [1] and 4 [4] are disabled for this operation.

During this processing, the digitizing elements of both channels are used resulting in a doubling of sample rate and since both channels are utilized, a doubling of the memory length occurs also. The result is a near doubling of the bandwidth.

While FIG. 1 shows a two channel implementation, any number of channels may be employed. In this exemplary implementation, channels 1 [1] and 2 [2] are grouped together as a channel 1/2 grouping [9] and channels 3 [3] and 4 [4] are grouped together in a channel 3/4 grouping [10].

As noted above, when channel 2 is selected for high bandwidth mode operation channel 1 [1] is disabled and front-ends 1 [5] and 2 [6] are utilized together to perform high bandwidth acquisitions of the input applied to channel 2 [2]. So, when high bandwidth mode is selected for channel 2, this configuration is referred to as high bandwidth mode channel 2.

Figure 25:
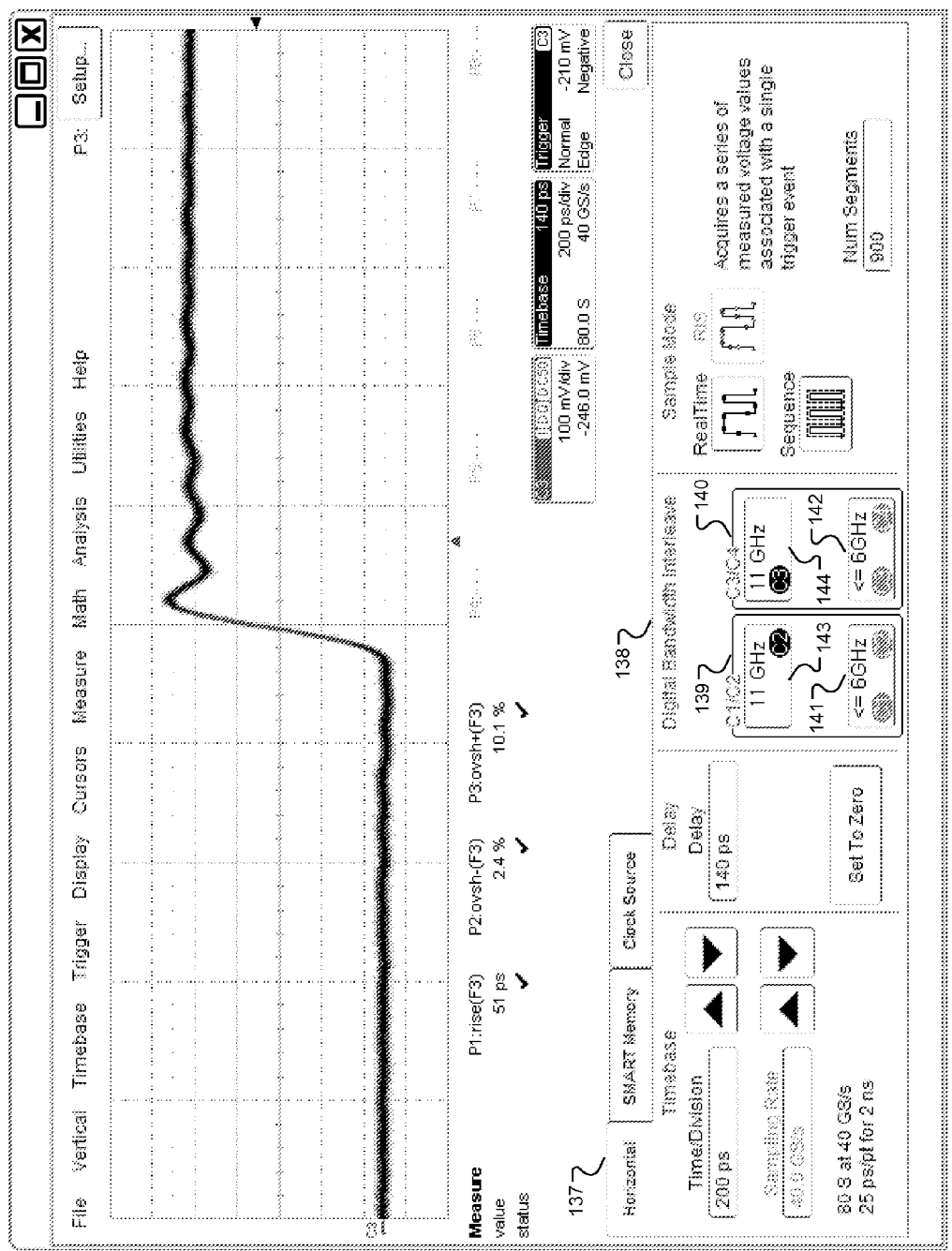
FIG. 25 is a digital oscilloscope screen showing a horizontal settings menu.

FIG. 25 illustrates this grouping and selection from a user interface (UI) perspective. FIG. 25 shows an oscilloscope screen with the horizontal configuration menu [137] shown. In this menu, one configuration block is the high bandwidth configuration [138]. The high bandwidth configuration [138] shows the two channel groupings: channels 1/2 [139] and channels 3/4 [140]. Each grouping has two buttons that toggle between normal operation of the channels 1/2 [141] and channels 3/4 [142] and high bandwidth mode channel 2 [143] and high bandwidth mode channel 3 [144]. FIG. 25 happens to show the oscilloscope operating in high bandwidth mode on high bandwidth channels 2 and 3.

Considering high bandwidth channel 2 operating in high bandwidth mode, the DC to 6 GHz band is provided to oscilloscope front-end 2. This band is designated as the low-frequency band or LF band and the path from the channel 2 input through the system is referred to as the LF path. The band from 6 to 11 GHz output from the diplexer passes through the high bandwidth circuitry and is eventually connected to oscilloscope front-end 1 through the RF relay. This band is referred to as the HF band and its path through the system is called the HF path.

While this embodiment has two frequency bands per high bandwidth channel, optionally three, four or more frequency bands may be used per high bandwidth channel. It is advantageous to configure the bands such that they are adjacent, as will be appreciated from the description below, although non-adjacent bands may be utilized in certain applications.

Figure 2A:
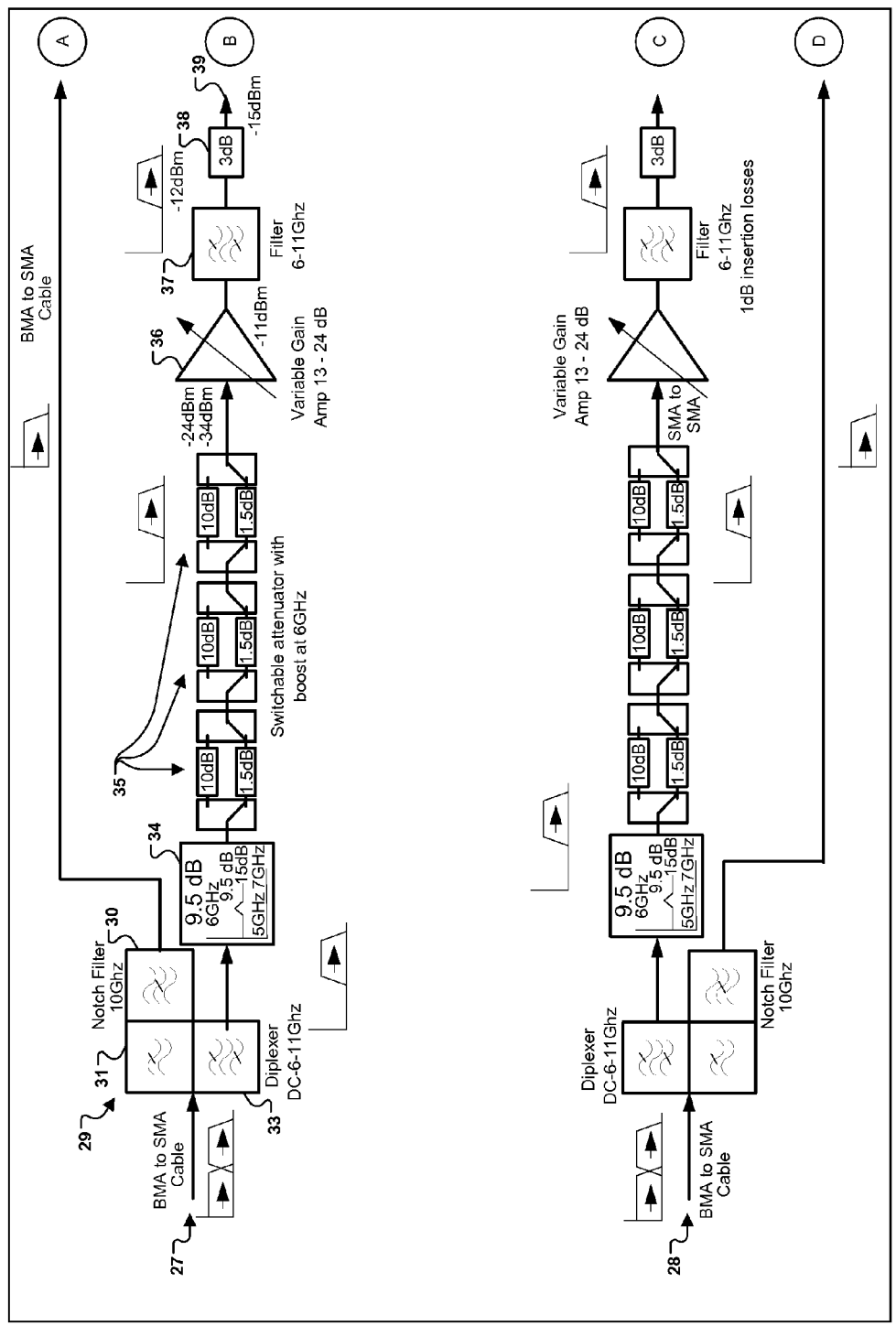
FIGS. 2A-2B show a block diagram representation of a two channel oscilloscope front end.
Figure 2B:
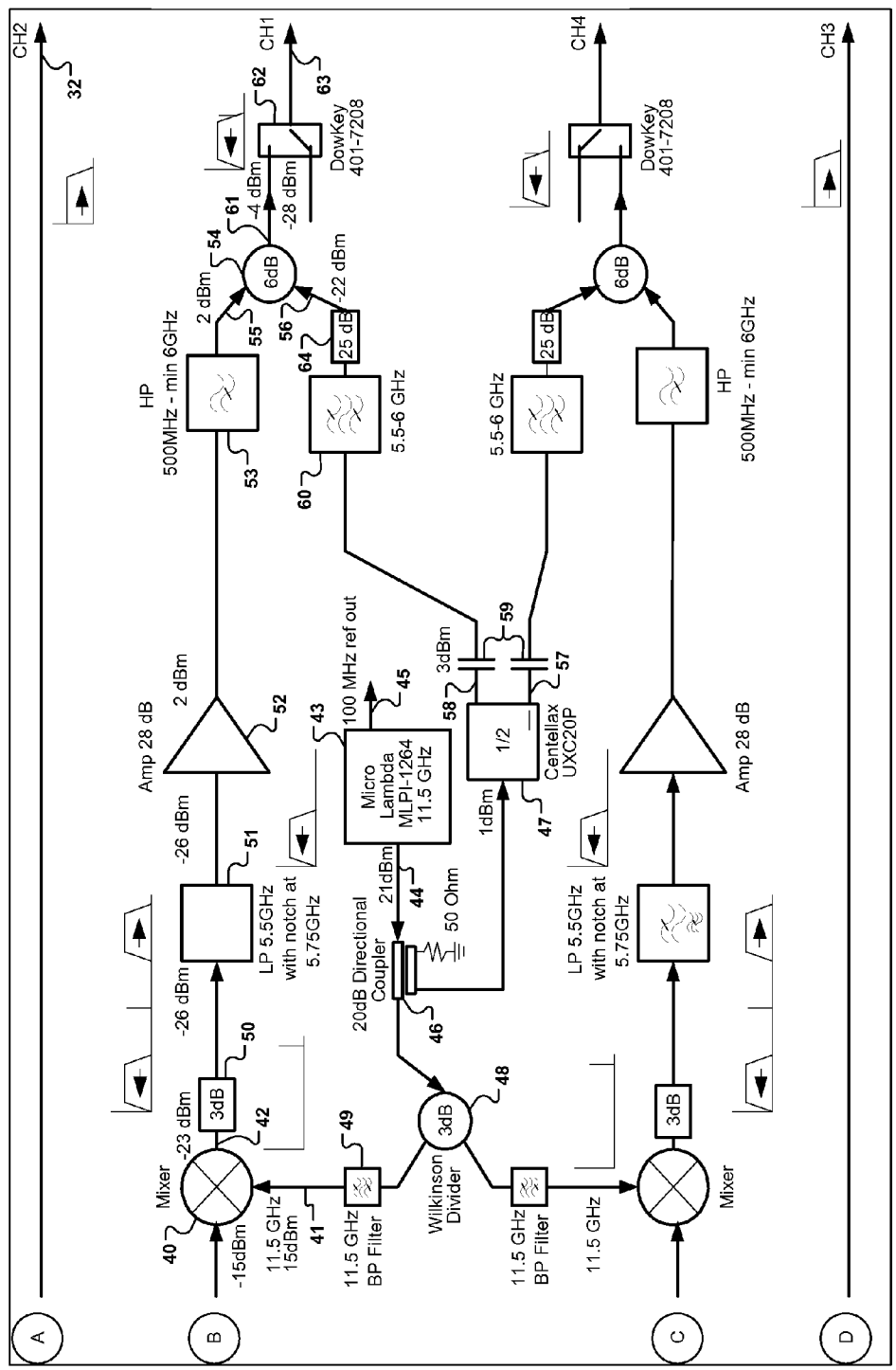

FIGS. 2A-2B show a block diagram depicting the high bandwidth hardware. The block diagram shows two high bandwidth channels with high bandwidth channel 2 [27] shown at the top and high bandwidth channel 3 [28] shown at the bottom, with shared circuitry in between. In FIGS. 2A-2B, the channel 2 input [27] enters a diplexer [29] which splits the signal into two frequency bands. The diplexer preferably provides good voltage standing wave ratio (VSWR) performance. Said differently, the diplexer preferably reflects as little of the input signal as possible. The DC to 6 GHz band [31] exits the diplexer [29] and passes through a notch filter [30] designed to specially notch out any 10 GHz in the LF path that can emanate from the oscilloscope front end 2 [32] due to a 10 GHz sample clock used internal to the oscilloscope. The LF signal then continues directly to oscilloscope front end 2 [32]. The remainder of the LF signal path includes the oscilloscope front-end and 20 GS/s digitizer associated with oscilloscope front-end 2 [32].

The HF signal path will now be described in greater detail. The HF band from 6 to 11 GHz [33], upon exiting the diplexer [29], enters an attenuator [34]. This attenuator [34] is designed to apply 9 dB of attenuation at lower frequencies and an extra 6 dB of attenuation (for a total of 15 dB attenuation) at higher frequencies. The breakpoint for this frequency dependent attenuator is around 6 GHz. The reason for this frequency dependent attenuation is due to the fact that the diplexer [29] pass band edge frequencies have been designed to provide the full DC to 6 GHz on the LF path, and therefore there is some attenuation of the 6 to 11 GHz band at lower frequencies. This frequency dependent attenuator puts back some of the signal content at low frequencies relative to high frequencies, thus serving to flatten the HF band. The HF band signal then enters a variable attenuator [35], designed to provide from 1 to 41 dB of attenuation. The HF band signal continues into a variable gain amplifier (VGA) [36] designed to provide from 13 to 24 dB of gain. Both the variable attenuator [35] and VGA [36] are designed to provide an overall amount of gain/attenuation to fix the VGA maximum output power at a constant level corresponding to a full-scale signal on the screen of the digital oscilloscope at the Volts/div (vdiv) setting specified by the oscilloscope user. The VGA maximum output level utilized is designed to be −10.48 dBm. The implication of this level will be described later.

The output of the VGA [36] passes to another band pass filter [37], through a 3 dB pad [38] and into the radio frequency (RF) input [39] of a mixer [40] at a maximum level of −14.48 dBm. The implication of this level will be described later. Since high frequency mixers tend not to fully isolate the RF input [39] and the intermediate frequency (IF) output [42], the band pass filter [37] is provided to sharply limit the frequency content to between 6 and 11 GHz. The RF-IF isolation of the mixer is typically −20 dB. This means that any signal entering the mixer RF input [39] can appear at the IF output [42] at the same frequency, but attenuated by only 20 dB. Furthermore, because one of the primary specifications of the diplexer [29] is input return loss (or good VSWR, as described earlier), some of the frequency rejection of the diplexer [29] has been traded off for better return loss and this band pass filter [37] is designed to supply the extra rejection.

The mixer local oscillator (LO) input [41] originates from an Yttrium-Iron-Garnet (YIG) tuned, fixed frequency, internally phase-locked oscillator (PLO) [43]. The PLO [43] multiplies an internal 100 MHz reference by 115 to provide an 11.5 GHz output [44] at an output power of 21 dBm. The 100 MHz reference is provided at an output [45] of the PLO and is connected to the oscilloscope 100 MHz reference input (not shown). This is to provide a fixed frequency and phase relationship between the LO of the high bandwidth unit and the sample clock of the oscilloscope. The 11.5 GHz output [44] passes through a 20 dB directional coupler [46] that picks off the LO for input to a frequency divider [47] whose purpose will be explained later. Then, the signal is split through a Wilkinson divider [48] whose purpose is to deliver the 11.5 GHz LO to both high bandwidth channels through an 11.5 GHz band pass filter [49]. The band pass filter [49] is utilized because the mixers may not have adequate RF-IF isolation, RF-LO isolation and/or IF-LO isolation. The band pass filter [49] limits the crosstalk between the two high bandwidth channels that share a common LO.

The LO enters the mixer LO input [41] at around +15 dBm and mixes with the 6 to 11 GHz band present at the mixer RF input [39]. The result at the mixer IF output [42] is two images of the 6 to 11 GHz band at different frequencies. The low frequency image appears in a band from 500 MHz to 5.5 GHz and is reversed in frequency. In other words, 6 GHz at the mixer RF input appears at 5.5 GHz at the IF output and 11 GHz at the mixer RF input appears at 500 MHz at the IF output. The high frequency image appears in a band from 17.5 GHz and 22.5 GHz. In addition to these two bands, because of imperfect LO-IF isolation, there is also an amount of 11.5 GHz leakage from the LO input [41] present at the mixer IF output [42]. The LO leakage power is about 0 dBm. The desired signal power in the 500 MHz to 5.5 GHz band is at about −23 dBm.

The mixer IF output [42] passes through a 3 dB pad [50] and enters an image reject low pass filter [51] designed together with a notch filter that rejects 5.75 GHz. The purpose of the notch filter will be described below. The main purpose of the filter [51] is to substantially reject the high frequency image along with the 11.5 GHz LO leakage.

The output of the low pass filter [51] passes to a fixed gain amplifier (FGA) [52] that amplifies the signal to approximately 2 dB maximum output power. The implication of this power level will be described below.

The FGA [52] output enters a DC reject filter [53] and enters a 6 dB power splitter/combiner [54] whose purpose is to combine the HF band present at one input [55] with an LO reference pilot tone present at the other input [56]. In an alternate embodiment a summing amplifier may be used in lieu of splitter/combiner [54].

The generation of the LO reference pilot tone will now be described. As mentioned previously, the 11.5 GHz LO [44] is picked off through a 20 dB directional coupler [46] and exits the pickoff at around 1 dBm. This 1 dBm LO signal enters a frequency divider [47] whose purpose is to divide the 11.5 GHz signal frequency in half thereby producing a 5.75 GHz output. The frequency divider has differential outputs. Therefore, it can be viewed as producing two single ended outputs [57] and [58] that are out of phase with each other by 180 degrees.

This 5.75 GHz signal, called the LO reference pilot tone, or simply the LO reference passes through DC blocking capacitors [59] and through a band pass filter [60] and through an attenuator [64] such that it is then attenuated to approximately 50 mV pk-pk, or about −22 dBm prior to entering the splitter/combiner [54]. The purpose of the band pass filter [60] is to pass the LO reference while limiting the crosstalk between each high bandwidth channel due to the mutual use of the single frequency divider.

The splitter/combiner output [61] consists of the sum of a frequency band in the 500 MHz to 5.5 GHz range (representing the heterodyned version of the band from 6 to 11 GHz, reversed in frequency) and the 5.75 GHz LO reference. The reference tone is at −28 dBm and the maximum HF signal power is at −4 dBm. Said differently, the HF band represents the signal content in the 6 to 11 GHz band, downconverted and frequency flipped to a band from 500 MHz to 5.5 GHz, with a small 5.75 GHz tone riding on the signal.

As mentioned previously, the RF relay [62] serves to switch the input to front-end 1 [63] between the oscilloscope input channel 1 [1] and the high bandwidth circuitry output of the splitter/combiner [54], so in high bandwidth mode, the relay is connecting this HF band to oscilloscope front-end 1 [63]. The remainder of the HF signal path includes the oscilloscope front-end and 20 GS/s digitizer associated with oscilloscope front-end 1 [63].

Before discussing how the waveforms are acquired and processed from front-ends 1 [63] and 2 [32] to form the high bandwidth channel 2 waveform, it is useful to discuss some considerations in the design of the high bandwidth circuitry. One consideration is dynamic range. The oscilloscope [11] allows seven different fixed Volts/division (vdiv) settings. These are 10, 20, 50, 100, 200, 500 mV/div and 1 V/div. The oscilloscope screen has 8 vertical divisions, and as seen in Table 2, this amounts to full-scale signals ranging from −18 to +22 dBm, or about 40 dB of dynamic range. As mentioned previously, the high bandwidth circuitry consists of a variable attenuator [35] and VGA [36], whose combination of attenuation and gain serves to provide a constant maximum power at the VGA [36] output of −11.48 dBm. This is accomplished through the use of attenuator and gain settings as specified for each vdiv in Table 2. The attenuations are set by digital control of the variable attenuator [35] and the variable gain is set by digital control of a digital-to-analog converter (DAC). The DAC provides an analog level corresponding to an input code and the analog level supplied to the VGA [36] controls its gain from between 13 and 24 dB. Table 1 shows a description and stage number assigned to each stage of the HF signal path, along with the gain/attenuation of each stage along with the noise figure.

TABLE 1

| Stage # | Stage Description | Gain/Attenuation | Noise Figure |
|---|---|---|---|
| 0 | Input | 0 | 0 |
| 1 | Diplexer | −1 | 1 |
| 2 | Fixed Attenuator | −8 | 8 |
| 3 | Frequency Dependent Attenuator | −6 | 6 |
| 4 | Variable Attenuator | $-10 \cdot atten_{vd} - 1$ | $10 \cdot atten_{vd} + 1$ |
| 5 | Variable Gain Amplifier (VGA) | $13 + gain_{vd}$ | 1.9 |
| 6 | BandPass Filter | −1 | 1 |
| 7 | Pad | −3 | 3 |
| 8 | Mixer | −8.5 | 9 |
| 9 | Pad | −3 | 3 |
| 10 | LowPass Filter | −0 | 0 |
| 11 | Fixed Gain Amplifier (FGA) | 28 | 3 |
| 12 | Splitter/Combiner | −6 | 6 |

It should be noted that the gains for stages 4 and 5 are variable and are determined by Table 2. Note that only a subset of the stages are shown.

TABLE 2

| Volts/Division (mV) | FullScale Input Power (dBm) | Variable Attenuator Setting | Variable Gain Setting (dB) |
|---|---|---|---|
| 10 | −17.96 | 0 | 10.48 |
| 20 | −11.94 | 0 | 4.46 |
| 50 | −3.98 | 1 | 6.5 |
| 100 | 2.04 | 1 | 0.48 |
| 200 | 8.06 | 2 | 4.46 |
| 500 | 16.02 | 3 | 6.5 |
| 1000 | 22.04 | 3 | 0.48 |

Figure 3:
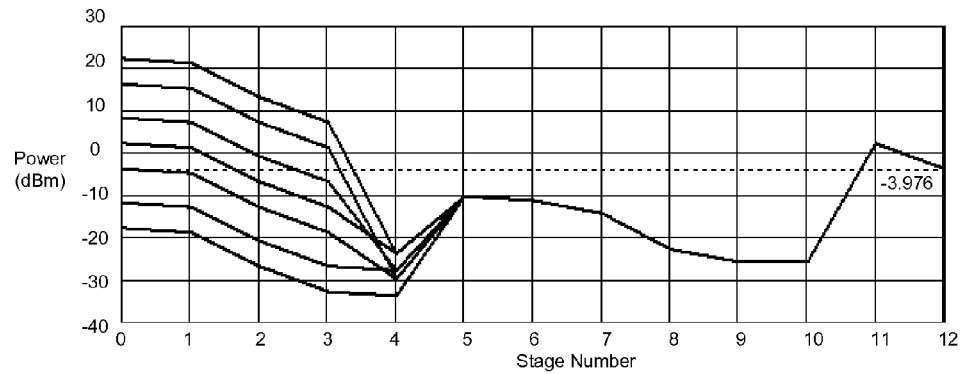
FIG. 3 is a graphical representation of radio frequency (RF) power at each stage of a high frequency (HF) signal path.
Figure 4:
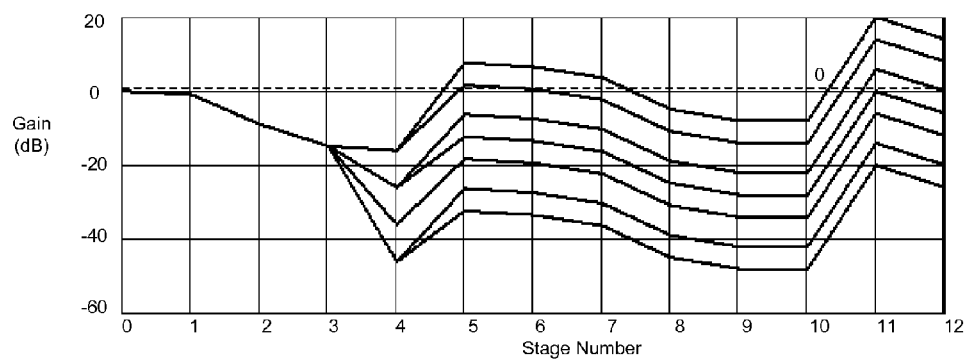
FIG. 4 is a graphical representation of an overall gain at each stage of the HF signal path.

The result of the settings in Table 2 sets the maximum power at all stages at and downstream from the VGA [36] output (stage 5). This can be seen in FIG. 3, where the maximum signal power is seen at each stage. The input power in FIG. 3 varies between −17 and +22 dBm depending on the oscilloscope vdiv setting, but the stage power is constant from the output of stage 5 onward. FIG. 4 depicts related overall gain at each stage of the HF signal path. Thus it is seen that the system design plus the gain/attenuation settings provide for the desired input range.

Another consideration is noise. The oscilloscope referred to in the embodiment has a signal-to-noise ratio (SNR) of approximately 36 dB. This may be calculated by considering the full-scale range of the oscilloscope at a given vdiv setting relative to the amount of noise present. If the noise is assumed to be "white noise", or in other words, is assumed that the noise power is equally spread over the 6 GHz bandwidth of the instrument, it can be assumed that a doubling of bandwidth would produce a 3 dB decrease in SNR to 33 dB best case, considering the fact that even if the high bandwidth circuitry is noise-free, the oscilloscope channel serves to limit the maximum achievable SNR. Since the high bandwidth circuitry is not typically noise-free, the design goal is to minimize the degradation of SNR below the 33 dB theoretical best case. It has been calculated that a 1 dB degradation of SNR can be tolerated and that a 32 dB SNR can be achieved if the HF path can be kept above approximately 39 dB.

Figure 5:
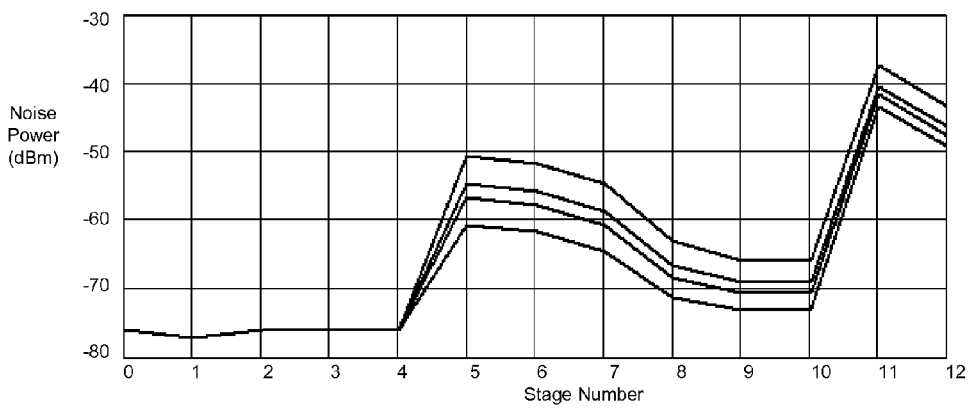
FIG. 5 is a graphical representation of a noise power at each stage of the HF signal path.
Figure 6:
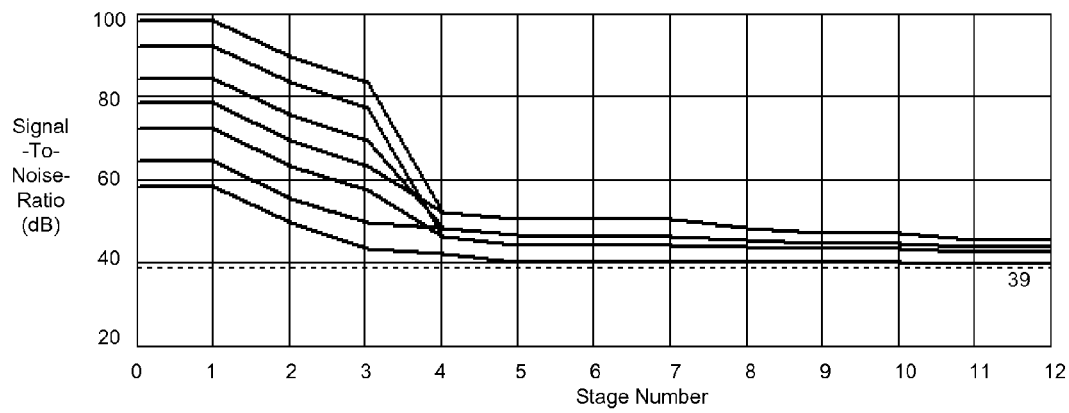
FIG. 6 is a graphical representation of a signal-to-noise ratio (SNR) at each stage of the HF signal path.
Figure 7:
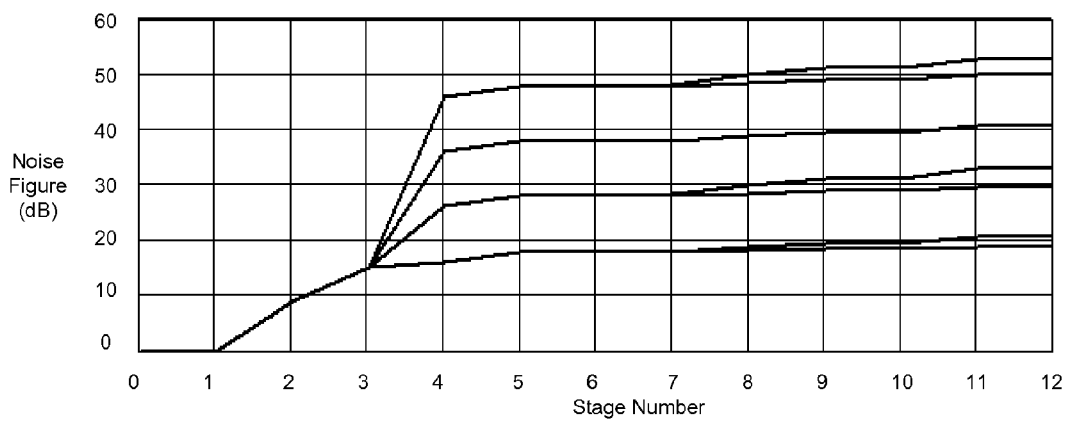
FIG. 7 is a graphical representation of an overall noise metric at each stage of the HF signal path.

To calculate this, first, the input noise power may be calculated using the theoretical noise power of a 50 Ohm resistor at room temperature as −173.91 dBm/Hz or −76.13 dBm in a 6 GHz bandwidth. This is the input noise power as shown in FIG. 5. Then, the cascaded noise figure may be calculated using accepted techniques for each of the vdiv settings specified, along with the gain/attenuation settings for these vdivs and noise figures of each stage as shown in Table 1. Suitable cascaded noise figure calculations are described in Adam, Stephen F., Microwave Theory and Applications, Prentice Hall, 1969, pp 490-500. The calculated overall noise figure at each stage in the HF signal path is shown in FIG. 7 where only the final stage noise figure is particularly significant. This noise figure may then be utilized to calculate the noise power at each stage in FIG. 5. The stage power shown in FIG. 3 along with the noise power shown in FIG. 5 may be used to calculate the SNR at each stage, as shown in FIG. 6. FIG. 6 shows that the final SNR of the HF signal path is kept above 39 dB for all vdiv cases. A similar series of calculations can be made for any desired SNR specification.

Another consideration is that of distortion. Distortion can produce unwanted tones, or spurs, in the frequency spectrum and serves to decrease the effective number of bits (ENOB) of the system. This is because the ENOB calculation includes noise and distortion components and not just the noise. Also, the size of the largest spur determines the spur-free dynamic range (SFDR), another relevant specification. It should be noted that spurs may be created inside the oscilloscope front-end and digitizer due to the waveform digitizing process. It may be deemed acceptable if no spurs significantly degrade the original oscilloscope performance. As an example, one design goal may be to keep all spurs created by the high bandwidth hardware below −40 dBc.

Distortion may be created by the two active components, the FGA [52] and VGA [36], along with the mixer [40]. Distortion components are kept to a minimum generally by good amplifier and mixer design, and by keeping power levels low in these devices.

In the case of the mixer [40], one factor affecting distortion is the mixer topology. In the preferred implementation, a triple-balanced, "medium level" mixer is utilized. The term "medium level" refers to the power of the LO delivered to the mixer LO input [41]. A second factor is the method of downconversion. The frequency downconversion process can be implemented with the LO frequency placed at a frequency below the frequency band of interest (low side downconversion) or at a frequency above the band of interest (high side downconversion). Low side downconversion preserves the frequency order of the band (i.e., it does not flip the frequency) but tends to produce a significant number of relatively large spurs. High side downconversion, while creating the complication of flipping the frequencies in the band, produces less and smaller spurs. The preferred implementation utilizes high side downconversion although either method is suitable.

Table 3 shows certain mixer specifications as they pertain to distortion components. The mixer utilizes a 15 dBm LO power. Typically, the input third order intercept point (IIP3) is 5 dB above the LO power and the input second order intercept point (IIP2) is 10 dB above that. As previously mentioned, the mixer RF input power is in this implementation kept at or below −14.48 dBm. Table 3 also shows the calculation of the four largest distortion products: the second and third order intermodulation products due to two tones (IM2 and IM3, respectively) and the second and third harmonics (H2 and H3). These have been calculated using commonly used rules-of-thumb supplied in Genesys 2004 RF Microwave Design Software—Simulation, Eagleware Corporation, 2004, pp 108-110. These tend to be somewhat conservative calculations and the actual distortion components may be substantially less. Table 3 shows that the largest calculated distortion component is IM2 at −44.48 dBc.

TABLE 3

| Power Specifications | Levels | Definition | Specification Governance |
|---|---|---|---|
| LO Power | 15 dBm | $P_{LO}$ | By Selection of LO Generator plus System Design |
| Input $3^{rd}$ Order Intercept Point (IIP3) | 20 dBm | Typically $IIP3 = P_{LO} + 5$ | By Mixer Design |
| Input $2^{nd}$ Order Intercept Point (IIP2) | 30 dBm | Typically $IIP2 = IIP3 + 10$ | By Mixer Design |
| RF input power | −14.48 dBm | $P_{RF}$ | By Gain Stackup in System Design |
| Distortion Components | Levels | Power Level Calculation | Frequency Locations |
| Second order intermods (IM2) | −44.48 dBc | $IM2 = -(IIP2 - P_{RF})$ | F1 + F2, F1 − F2 |
| Third order intermods due to two tones (IM32) | −68.96 dBc | $IM32 = -2 \cdot (IIP3 - P_{RF})$ | 2 · F1 − F2, 2 · F1 + F2, 2 · F2 − F1, 2 · F2 − F1 |
| $2^{nd}$ Harmonic (H2) | −50.48 dBc | H2 = IM2 − 6 | 2 · F |
| $3^{rd}$ Harmonic (H3) | −78.5 dBc | H3 = IM32 − 9.542 | 3 · F |

In the case of the VGA [36], one distortion-related consideration is the output 1 dB compression point (P1dB). This is the point where the output is compressed to the point that an output signal appears 1 dB lower. This point typically occurs near the saturation level of the amplifier. To avoid distortion, it may be desirable to keep the output power well below this point. Table 4 shows the VGA specifications and distortion calculations. These calculations are similar to that of the mixer calculations. Table 4 shows that with the aforementioned limit on VGA output power at −10.48 dBm, the largest distortion components are IM2 at −40.48 dBm and H2 at −46.48 dBm. Again, these tend to be somewhat conservative calculations and the actual distortion components may be substantially less.

TABLE 4

| Power Specifications | Levels | Definition | Specification Governance |
|---|---|---|---|
| 1 dB compression point (P1 dB) | 10 dBm | P1 dB | By Amplifier Design |
| Output $3^{rd}$ Order Intercept Point (OIP3) | 20 dBm | Typically OIP3 = P1 db + 10 | By Amplifier Design |
| Output $2^{nd}$ Order Intercept Point (OIP2) | 30 dBm | Typically OIP2 = OIP3 + 10 | By Amplifier Design |

TABLE 4-continued

| | | | |
|---|---|---|---|
| Output power | −10.48 dBm | $P_{VGA}$ | By Gain Stackup in System Design |

| Distortion Components | Levels | Power Level Calculation | Frequency Location: |
|---|---|---|---|
| Second order intermods (IM2) | −40.48 dBc | IM2 = −(IIP2 − $P_{VGA}$) | F1 + F2, F1 − F2 |
| Third order intermods due to two tones (IM32) | −60.96 dBc | IM32 = −2 · (IIP3 − $P_{VGA}$) | 2 · F1 − F2, 2 · F1 + F2, 2 · F2 − F1, 2 · F2 − F1 |
| $2^{nd}$ Harmonic (H2) | −46.48 dBc | H2 = IM2 − 6 | 2 · F |
| $3^{rd}$ Harmonic (H3) | −70.5 dBc | H3 = IM32 − 9.542 | 3 · F |

The FGA [52] calculation is similar to the VGA calculation. Because the FGA output is set at +2 dBm, a higher power amplifier is utilized with a PldB of +20 dBm, as shown in Table 5. Table 5 shows that the largest distortion components are IM2 at −38 dBm and H2 at −44 dBm. Again, the calculations tend to be conservative and the actual distortion components may be smaller.

TABLE 5

| Power Specifications | Levels | Definition | Specification Governance |
|---|---|---|---|
| 1 dB compression point (P1 dB) | 20 dBm | P1 dB | By Amplifier Design |
| Output $3^{rd}$ Order Intercept Point (OIP3) | 30 dBm | Typically OIP3 = P1 dB + 10 | By Amplifier Design |
| Output $2^{nd}$ Order Intercept Point (OIP2) | 40 dBm | Typically OIP2 = OIP3 + 10 | By Amplifier Design |
| Output power | 2.021 dBm | $P_{FGA}$ | By Gain Stackup in System Design |

| Distortion Components | Levels | Power Level Calculation | Frequency Locations |
|---|---|---|---|
| Second order intermods (IM2) | −37.98 dBc | IM2 = −(IIP2 − $P_{FGA}$) | F1 + F2, F1 − F2 |
| Third order intermods due to two tones (IM32) | −55.96 dBc | IM32 = −2 · (IIP3 − $P_{FGA}$) | 2 · F1 − F2, 2 · F1 + F2, 2 · F2 − F1, 2 · F2 − F1 |
| $2^{nd}$ Harmonic (H2) | −43.98 dBc | H2 = IM2 − 6 | 2 · F |
| $3^{rd}$ Harmonic (H3) | −65.5 dBc | H3 = IM32 − 9.542 | 3 · F |

Accordingly, the above described techniques may optionally be used to address performance and signal fidelity aspects such as dynamic range, noise, distortion, crosstalk and input return loss (or VSWR) from the hardware design perspective.

Once high bandwidth mode has been selected (as shown in FIG. 25), the RF relay [62] may be configured, the variable gain and attenuation may be selected (based on the channel vdiv setting) and applied to the variable attenuator [35] and VGA [36] and input signals may be continuously applied to the oscilloscope front-ends. In the case of the high bandwidth channel 2 input [27], the LF band may be applied to oscilloscope front-end 2 [32] and the HF band passing through the aforementioned high bandwidth hardware is applied to oscilloscope front-end 1 [63]. The LF band may optionally have no additional gain or attenuation applied by the high bandwidth hardware and is acquired at the vdiv specified for the high bandwidth channel. As can be seen in FIG. 3, the final maximum output power of the HF band in this embodiment is −3.976 dBm, which, as can be seen in Table 2 is the full-scale power corresponding to the 50 mV/div oscilloscope setting. Therefore, the HF band in this embodiment is acquired by the oscilloscope at 50 mV/div.

Figure 27:
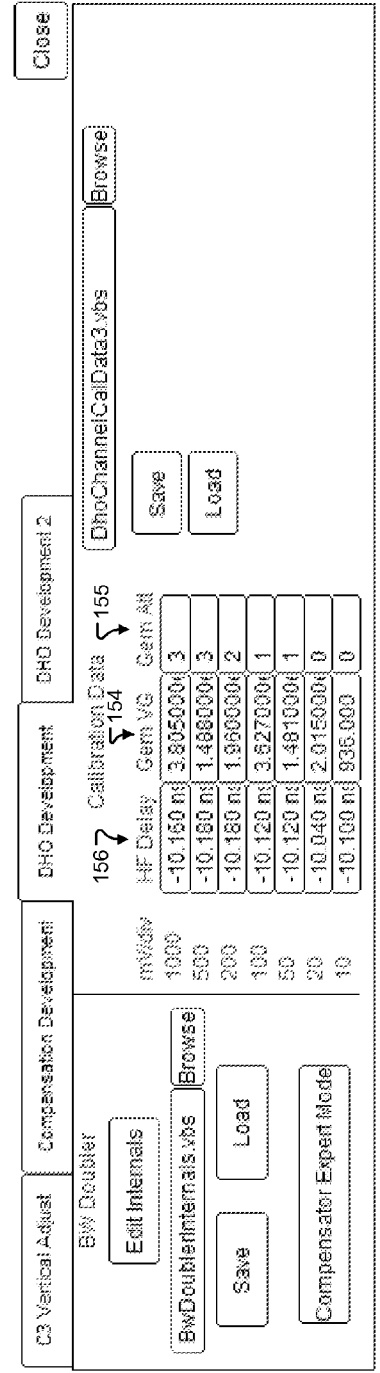
FIG. 27 is a digital oscilloscope screen fragment showing acquisition system settings.

FIG. 27 shows an internal calibration menu that shows the variable gain (shown as Gem VG) [154] and variable attenuation settings (shown as Gem Att) [155] are set. These settings are arrived at during factory calibration of the unit.

Figure 26:
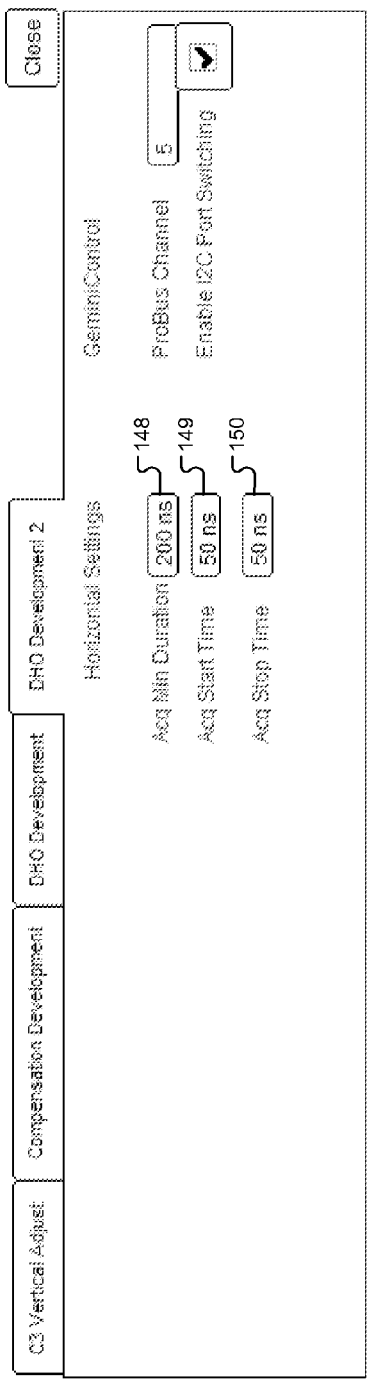
FIG. 26 is a digital oscilloscope screen fragment showing an internal acquisition configuration.

FIG. 26 shows some additional information that may be used to control how waveform acquisitions will proceed. FIG. 26 shows acquisition minimum duration [148], start time [149], and stop time [150]. These are settings used to control the minimum acquisition time duration, the extra time needed to the left of the waveform and the extra time needed to the right of the waveform, respectively, as it will be shown on the screen. This extra time may provide for LO reference recovery, which will be further described below, and for waveform digital processing, that consumes points for filter startup to the left of the waveform or possibly consumes points to the right of the waveform to account for filter delay.

Once the acquisition has been configured, the oscilloscope may arm the acquisition and acquire LF and HF portions of the input signal. The remainder of this section describes the digital processing of the LF and HF waveforms and the recombination of the waveforms into a single high bandwidth waveform acquisition in an illustrative embodiment.

Figure 8:
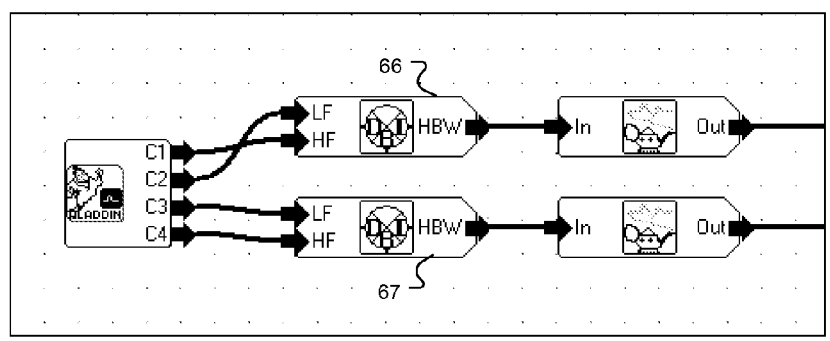
FIG. 8 is a block diagram representation of a signal processing configuration.
Figure 9:
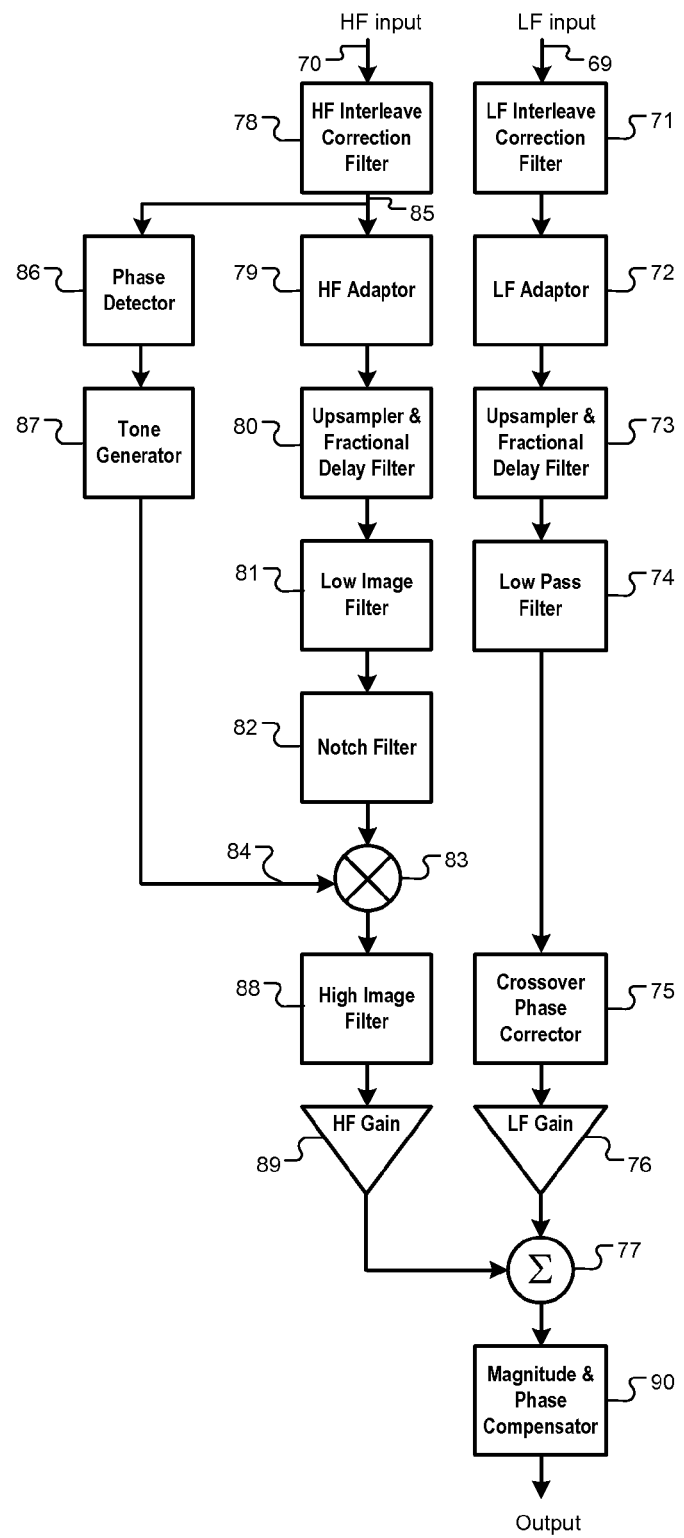
FIG. 9 is a block diagram representation of a digital signal processing (DSP) system.

FIG. 9 is a block diagram of the digital system utilized to process a single high bandwidth channel. FIG. 8 shows the channel 2 high bandwidth processor [66] and the channel 3 high bandwidth processor [67] in the processing system (also called the processing web) of the oscilloscope, and FIG. 9 serves as a block diagram showing the operation of one such processor.

The signals applied at the oscilloscope front-ends [32 and 63] are acquired. In the preferred implementation, the acquisition system includes interleaved ADCs, buffers, and high speed memory such as SRAM or modified DRAM [not shown] to receive the digitized data stream.

After the waveforms are acquired by the oscilloscope, they may be applied appropriately to the HF input [70] and LF input [69] in FIG. 9. Each waveform acquired by the oscilloscope may contain not only the waveform data consisting of an array of voltage levels, but also extra information that helps in the interpretation of the data points, including horizontal offset, horizontal interval, number of points, ADC sampling phase, vertical offset, and vertical step. In this implementation, horizontal offset is the time (relative to the oscilloscope trigger point) associated with the first point of the waveform. Also in this implementation, horizontal interval is the time between each sample point (the reciprocal being the sample rate) and the number of points is the number of points in the waveform. The ADC sampling phase describes which of the two interleaved 10 GS/s digitizers sampled the first waveform point (with the understanding that every other point is taken from every other digitizer). The vertical offset in this implementation is the voltage associated with code 0, the lowest ADC output. Vertical step is the voltage between each code or step in the ADC output.

FIG. 27 shows, in addition to the variable gain [154] and attenuation [155] settings determined for each vdiv, a calibration called HF delay [156]. In this implementation HF delay is the measured path delay of the HF path relative to the LF path. Described differently, the LF and HF portions of the signal travel through different paths with the HF portion, in this embodiment, traveling through a comparatively long array of analog processing elements. This path may delay the HF waveform relative to the LF waveform. The HF delay value [156] is used to correct for the calculated difference in path propagation times and depends on the vdiv setting. A negative HF delay means that the HF path should be advanced to arrive at the proper time. The high bandwidth system may account for the path propagation time differences in hardware or, as in preferred embodiments, the propagation amount may be measured and accounted for in the digital system by adding the HF delay to the horizontal offset of the HF waveform acquired prior to processing.

In the preferred implementation, prior to processing the waveforms the digital elements shown in FIG. 9 in the HF and LF path are assembled except for the elements designated as adaptors ([72] and [79]) and upsampler and fractional delay filters ([73] and [80]). The filters may be built according to specifications shown in the dialog in FIG. 10. Once these elements are assembled, the system built with these elements may be analyzed to account for three possible effects of each filter: the upsample factor, the startup samples, and the delay. The upsample factor is in this embodiment the factor by which the waveform sample rate is increased as it passes through a filter element and is generally 1 for all of the filters, except the upsampler and fractional delay filter, where the upsample factor is generally 2. The startup samples in this embodiment correspond to the time required for the impulse response to end or die down to an acceptable amount. In the case of the high bandwidth system, the filters are preferably finite impulse response (FIR) filters for simplicity of design and for simplicity in calculating delay and startup and are symmetric (to avoid group delay variations). Asymmetric filters and infinite impulse response filters or other discrete-time or continuous-time filters may be better suited to certain applications. In the case of the symmetric FIR filter, the startup time is the filter length and the delay (in samples) may be half the filter length. The analysis of the system paths with filter upsample factors, startup samples, and delay accounted for produces overall equivalent filters from the standpoint of these three factors for the digital signal paths leading from the waveform inputs to the mixing node and the summing node. Calculation of these equivalent filters leads to a determination of integer and fractional delay of each path relative to the other. The integer delay portion is accounted for in the design of the adaptors ([72] and [79]), whose primary purpose is to delay the waveform an appropriate number of integer samples. The fractional delay portion is in this embodiment accounted for in the design of the upsampler ([73] and [80]).

Each upsampler ([73] and [80]) is designed utilizing a polyphase filter arrangement where each filter phase is calculated by sampling a Sinc (Sinx/x) pulse. Simply shifting the Sinc prior to sampling accomplishes the fractional delay. Suitable fractional delay filters and upsampling filters (sometimes referred to as interpolating filters) designs may be found in Smith, Julius O., MUS420/EE367A Lecture 4A, Interpolated Delay Lines, Ideal Bandlimited Interpolation, and Fractional Delay Filter Design, Stanford University.

In the preferred embodiment all of the digital processing elements are built once at inception, except for the adaptors ([72] and [79]) and upsampler and fractional delay filters ([73] and [80]). These are preferably built on each waveform acquisition to account for variations in the horizontal waveform information. These processing elements are also preferably built so that the processed waveforms arrive at the summing node at the appropriate time.

Consider the LF input [69] in FIG. 9. The path begins with the LF signal entering the LF Interleave correction filter [71]. A description of a suitable filter [71] is described in U.S. patent application Ser. No. 11/280,493, filed Nov. 16, 2005 by Mueller et al. and entitled "Method And Apparatus For Artifact Signal Reduction In Systems Of Mismatched Interleaved Digitizers", now U.S. Pat. No. 7,386,409, which is incorporated herein by reference. As explained in the '409 patent, this filter may be designed to improve the digitizer matching of the two interleaved 10 GS/s digitizers that produce a 20 GS/s sample rate. As such, it serves to reduce the size of distortion components resulting from inadequate digitizer frequency response matching.

The LF waveform then enters the LF adaptor [72], which serves to delay the waveform by an integer number of samples. The waveform then enters the upsampler and fractional delay filter [73]. This filter [73], as mentioned previously, serves to increase the sample rate from 20 GS/s to generally 40 GS/s and to provide fractional sample delay of the waveform. This upsampling is acceptable as the frequency content of the LF input signal has been band limited to 6 GHz by the diplexer at the high bandwidth channel input and by limitations of the oscilloscope front-end in this embodiment. The upsampler [73] may be configured based on upsampler settings [93] in the dialog shown in FIG. 10. This dialog specifies the upsample factor [94], the sample distance [95] and an optimization [96]. The upsample factor [94] is generally set to 2, but higher upsample factors can be utilized. The sample distance [95] refers to the distance in samples from the input waveform to apply the sin(x)/x interpolation. Said differently, it is one half the length of each filter phase where the number of phases is determined by the upsample factor [94].

Figure 12:
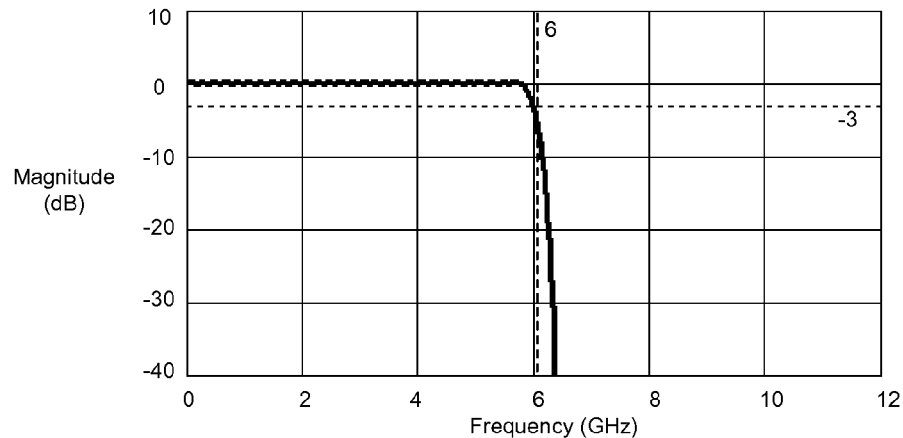
FIG. 12 is a graphical representation of a low frequency (LF) low pass (LP) filter magnitude response.

Referring once again to FIG. 9, the upsampled LF waveform then enters a low pass filter [74]. The response of the exemplary low pass filter is shown in FIG. 12. The filter [74] is preferably built according to the low pass filter specifications [97] shown in FIG. 10 and using a technique called frequency sampling, a suitable description of which is provided in Jong, Methods of Discrete Signal and Systems Analysis, McGraw Hill, 1982, pg. 369. The low pass filter specifications [97] dictate 400 filter coefficients [98], a low cutoff at 0 [99], a high cutoff at 6 GHz [100] and a transition band of 800 MHz [101]. The main purpose of this filter [74] in this embodiment is to reject noise and spurs in the LF path beyond 6 GHz.

The LF waveform then enters a crossover phase correction element [75]. As will be shown, in this embodiment there is an approximately 200-300 MHz wide region where the LF and HF bands interfere. This region is designated as the crossover region. It is preferable that this interference be constructive in nature. One way to accomplish this is to provide that the phase of the LF path relative to the HF path is essentially zero while the bands are transitioning. One relevant design criterion is that sharp filters tend to have extreme phase changes near the band edges. The crossover phase correction element [75] may compensate for this by making the relative phase approximately zero throughout the crossover region. A description of a suitable crossover phase correction element [75] is found in the abandoned U.S. pat. application Ser. No. 11/280,671, filed Nov. 16, 2005 by Pupalaikis, et al., entitled "Method of Crossover Region Phase Correction When Summing Multiple Frequency Bands", the contents thereof being incorporated herein by reference.

The phase corrected and low pass filtered LF band then enters a scaling element [76] and then the summing node [77]. This operation will be described following the description of the HF path processing.

The HF waveform [70] enters an interleave correction filter [78], an adaptor [79], and an upsampler and fractional delay filter [80] that in the preferred embodiment works in the same manner as previously described for the LF path, but with different internal design specifications depending on the ADC matching of the HF signal path, and the delay of the HF path.

Figure 13:
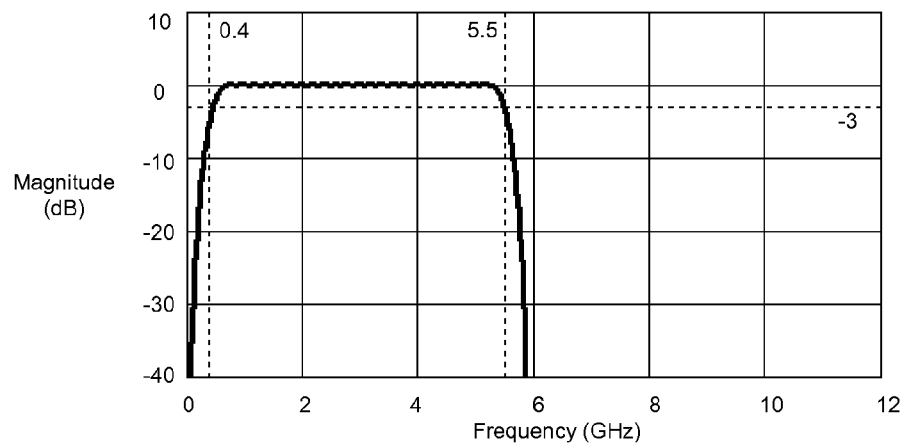
FIG. 13 is a graphical representation of a high frequency (HF) low image filter magnitude response.

Still referring to FIG. 9, the HF waveform then enters the HF low image filter [81]. This filter may be designed according to the HF low image filter specifications shown in FIG. 10 to provide a response as shown in FIG. 13. The filter may be a symmetric FIR filter built utilizing frequency sampling methods as described above. Exemplary specifications provide 400 filter coefficients [103], a low cutoff at 300 MHz [104], a high cutoff at 5.5 GHz [105] and a transition band of 800 MHz [106]. This filter [81] may be designed to reject all frequency content outside of the band of interest from 500 MHz to 5.5 GHz. It may also be designed to reject DC, as any DC offset of the channel might be interpreted as 11.5 GHz frequency content, which would in turn degrade the signal. Also, the filter [81] may be especially designed to reject noise and spurs outside of the band of interest.

Figure 14:
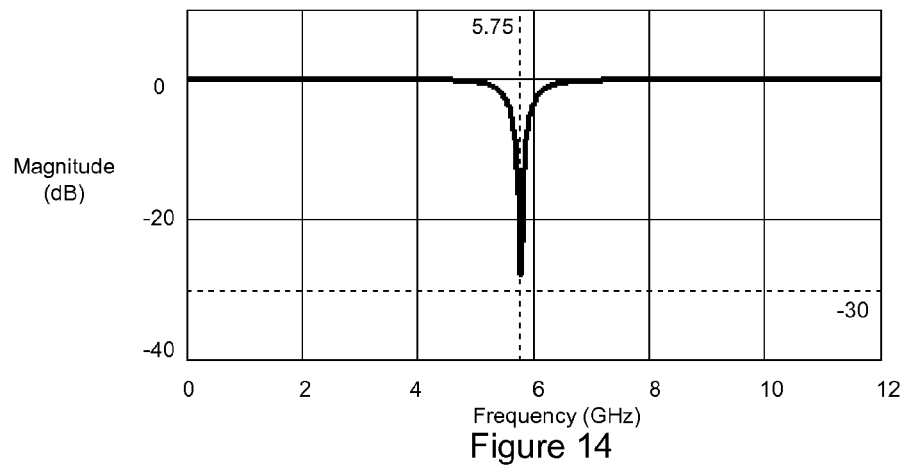
FIG. 14 is a graphical representation of a HF notch filter magnitude response.

The HF waveform then enters a 5.75 GHz notch filter [82]. This filter may be designed to remove the 5.75 GHz LO reference tone riding on the signal. The purpose of this tone will be described shortly, but in the HF path to the summing node [77], it is preferably rejected. The notch filter [82] may be designed according to the notch filter specifications [107] shown in FIG. 10 and its response is shown in FIG. 14. The filter is a single biquad filter section designed utilizing a bilinear transformation to convert the following analog prototype filter to digital:

$$H(s) = \frac{s^2 + \omega_0^2}{s^2 + \frac{\omega_2}{Q} \cdot s + \omega_0^2}$$ Equation 1 where $\omega_0 = 2 \cdot \pi \cdot f_0$ and $$Q = \frac{f_0}{\Delta f}$$

are dictated by the notch filter specifications of $f_0$ (the notch filter frequency [108]) and $\Delta f$ (the notch filter bandwidth [109]). The bilinear transformation is discussed further in Pupalaikis, Bilinear Transformation Made Easy, ICSPAT 2000 proceedings, CMP Publications, 2000. Since the filter in this embodiment is infinite impulse response (IIR), there is no filter length per se so filter startup samples [110] are specified to account for filter startup. While processing of the HF low image filter is described as taking place before the processing of the notch filter, their order may be reversed without any adverse effect (a design option that likewise applies to many of the other filter topologies described herein, as will be understood in the context of this detailed description).

Figure 15:
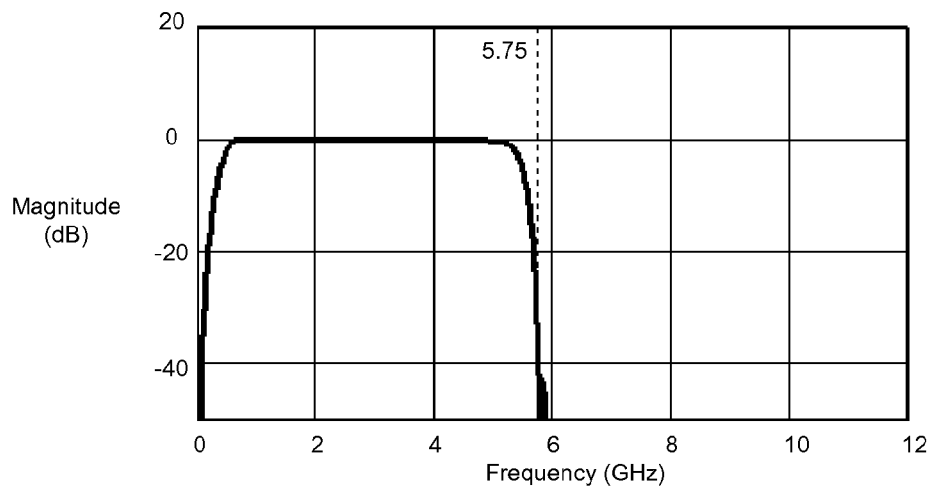
FIG. 15 is a graphical representation of the combination of the HF low image and the notch filter response.
Figure 16:
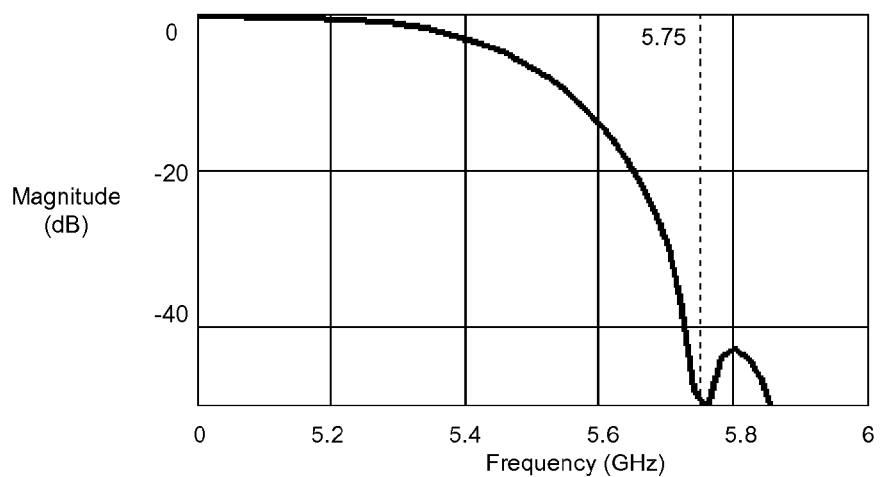
FIG. 16 is a graphical representation of the combination of the HF low image and notch filter response showing rejection at the reference tone frequency.

The combined response of the HF low image filter [81] and the 5.75 GHz notch filter [82] is shown in FIG. 15 with a zoomed section showing the rejection of the 5.75 GHz LO reference shown in FIG. 16. FIG. 16 shows that the 5.75 GHz LO reference has been attenuated by approximately 50 dB and has been essentially removed from the HF waveform in the preferred embodiment.

The generation of the digital LO [84] begins in this embodiment with the split in the HF path [85]. Before the digital LO is generated, the phase of the LO may first be determined. The LO phase may be determined based on the LO reference riding on the HF waveform. Referring back to FIGS. 2A-2B, one can see that the PLO output [44] may be delivered to the mixer LO input [41] along one signal path, and may be simultaneously picked off, divided down in frequency, and inserted into the HF waveform as the LO reference at the splitter combiner [54]. This LO reference signal has a constant phase relationship to the LO waveform delivered to the mixer. It is preferable that the LO reference has a constant phase relationship to the LO. As such, the LO reference tone may carry the phase information required to determine the phase of the LO (with a constant offset). The constant offset difference between the LO reference and the actual LO may be accounted for through the calibration of HF delay [156] shown in FIG. 27. As mentioned previously, there is a notch filter [51] in the HF hardware path shown in FIGS. 2A-2B that rejects any 5.75 GHz coming from the input. Therefore, the 5.75 GHz tone is substantially due to the 5.75 GHz LO reference inserted at the splitter/combiner [54] in this embodiment.

One way to generate the digital LO that is phase locked to the LO reference tone is to utilize a digital phase-locked loop (PLL). A less computationally intensive option, used in this embodiment, makes use of the fact that the frequency of the LO reference tone relative to the oscilloscope sample clock is relatively stable due to the fact that the 100 MHz PLO reference output [45] is supplied to the oscilloscope as the reference that generates the oscilloscope's sample clock. Furthermore, because the LO reference in this embodiment is relatively high in frequency (preferably as high as possible for capture by an oscilloscope front-end with 6 GHz of bandwidth), only a small number of cycles are required to accurately determine the phase of the LO reference.

One way to determine the phase of the 5.75 GHz LO reference is to take the discrete Fourier transform (DFT) of some number of samples of the HF waveform and pick out the frequency component that occurs at 5.75 GHz. In this embodiment, the phase of this frequency component is the phase of the LO reference. Since the sample clock generator in the oscilloscope and the LO are generated using the same 100 MHz reference (i.e. the LO and the sample clocked are locked together), there is no ambiguity regarding the exact frequency bin in the DFT containing the 5.75 GHz component. In other, words, even if there were slight errors in the exact frequency of the LO and therefore the 5.75 GHz LO reference, these slight errors would occur simultaneously in the frequency of the sample clock, and if one assumed that the oscilloscope sample rate was exactly 20 GS/s, the LO reference would be measured at 5.75 GHz.

Figure 10:
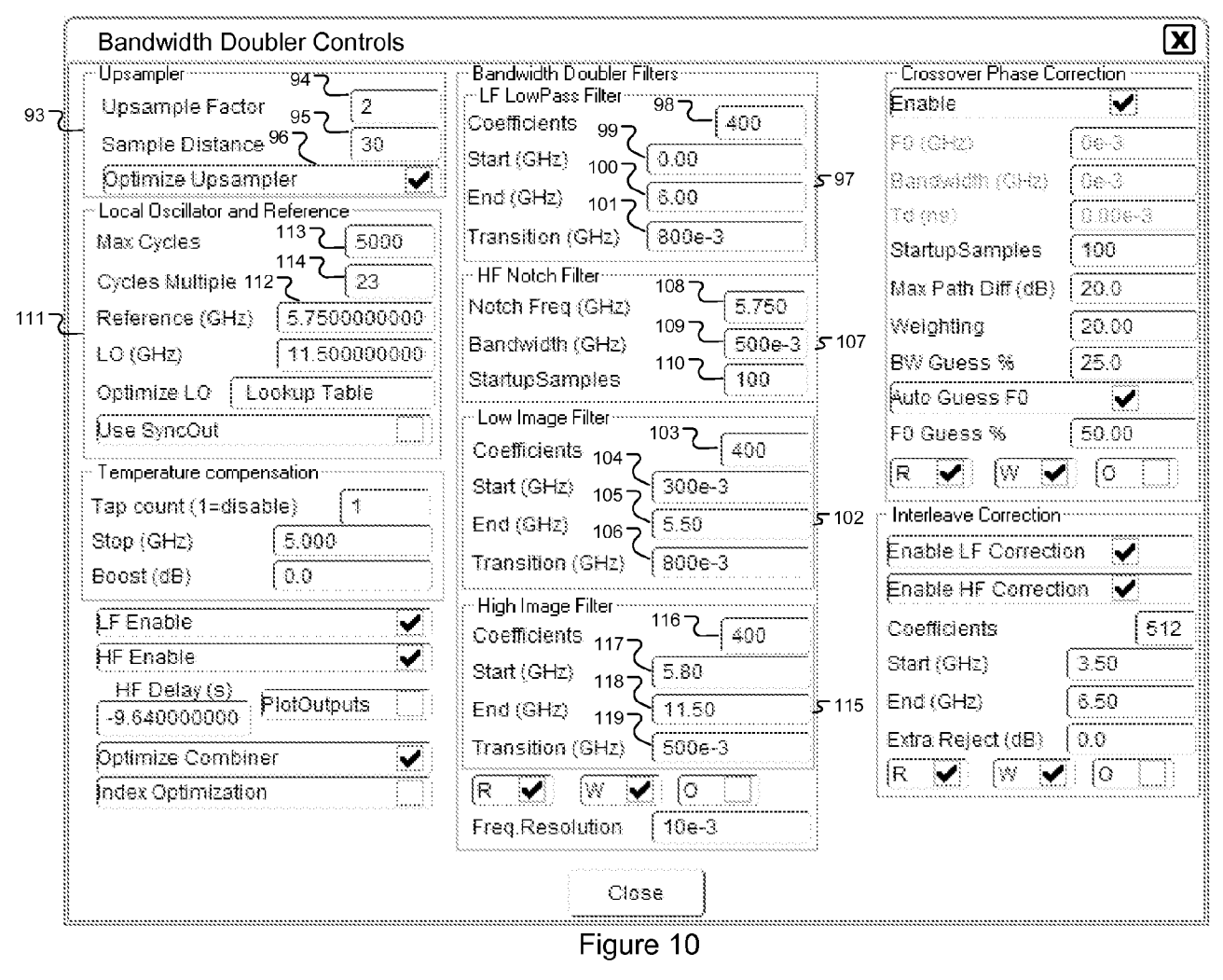
Figure 11:
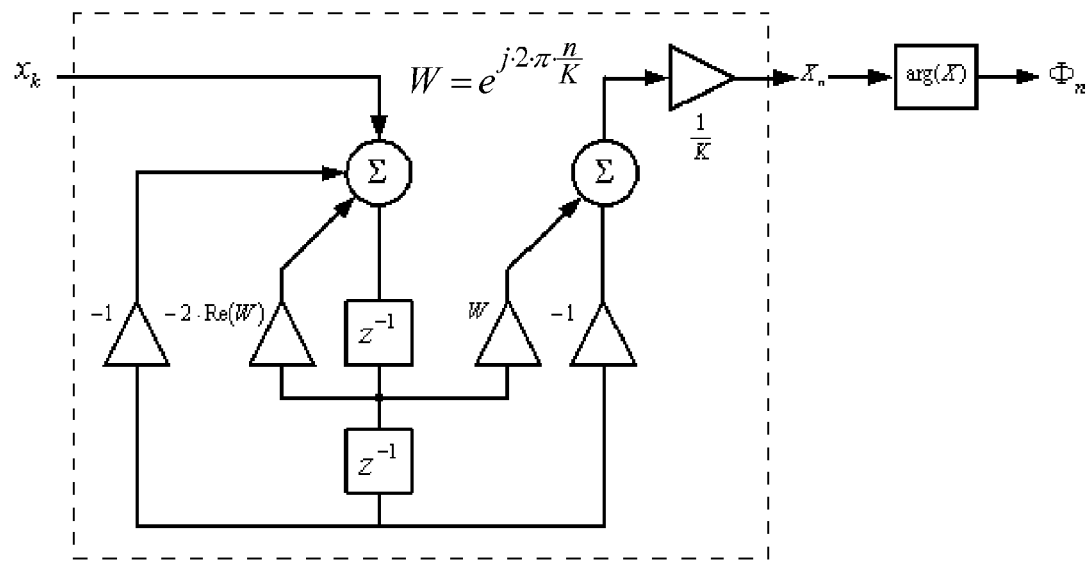
FIG. 11 is a block diagram representation of a calculation of the phase of a reference tone.

Since the DFT and even the fast Fourier transform (FFT) are comparatively computationally intensive, and because the DFT provides more information than is actually needed in this embodiment, an alternate method for tone detection is preferred. This method is called the Goertzel algorithm and is described in Digital Signal Processing Applications Using The ADSP-2100 Family, Prentice Hall, 1990, pg. 458. The block diagram of a digital processing element that accomplishes the LO reference phase is shown in FIG. 11. In FIG. 11, the number of points utilized (K) and the frequency bin (n) may be determined by the local oscillator and reference specifications [111] shown in FIG. 10. The specifications provide in this embodiment that the LO reference is at 5.75 GHz [112], to use a maximum of 5000 cycles for LO determination [113], and that the cycles are to be an integer multiple of 23 [114]. The cycles multiple makes the number of samples integer and therefore allows for phase detection without resorting to the technique of windowing. The minimum number of LO reference cycles available in a given waveform is dictated indirectly by the specification of the minimum acquisition duration [148], as specified in FIG. 26.

Figure 17:
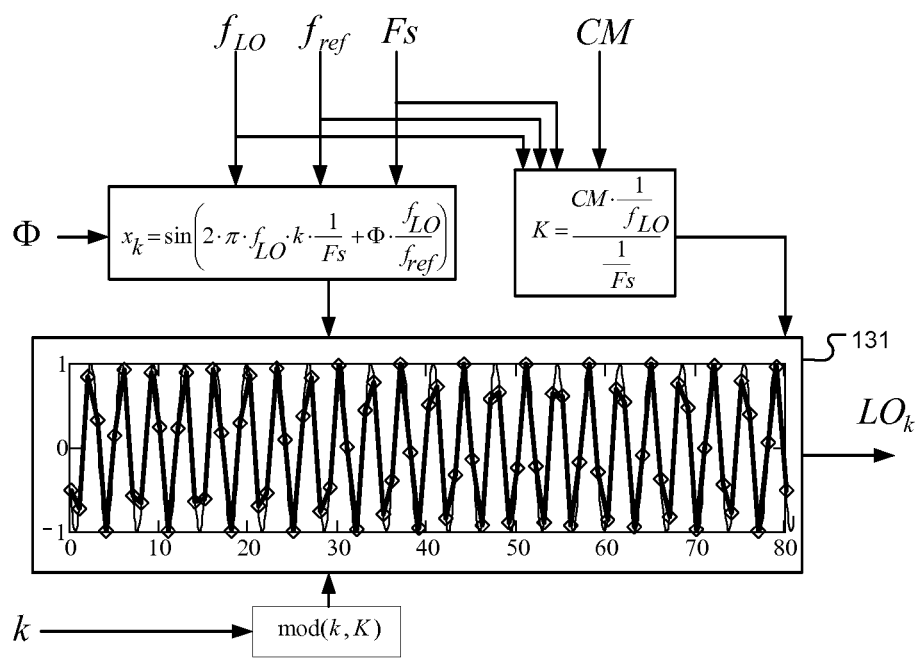
FIG. 17 is a representation of a digital local oscillator (LO) tone generator.

Once the phase detector [86] has measured the phase of the LO reference (which is preferably performed for every individual waveform acquired), it may be passed to the digital LO generator [87]. A block diagram of the LO generator [87] is shown in FIG. 17. FIG. 17 shows that the tone may be generated utilizing a lookup table [131] utilizing the local oscillator and reference specifications [111] as shown in FIG. 10. The specifications provide in this embodiment that the cycles multiple [114] is 23, which means that the sine wave, regardless of phase, will repeat every 80 samples. Therefore, a table of 80 sine wave values is generated for the lookup table [131]. The lookup table may be utilized to calculate the LO sine wave value for each point k by looking up the value at element mod(k,K) to determine the proper LO waveform value at point k.

This means that for every waveform point in the HF signal, an accompanying LO waveform signal value can be determined that is phase locked relative to the HF signal, and is substantially similar to a value that would be determined if the analog LO signal applied to the mixer LO input [41] shown in FIGS. 2A-2B were sampled along with the HF signal.

Figure 18:
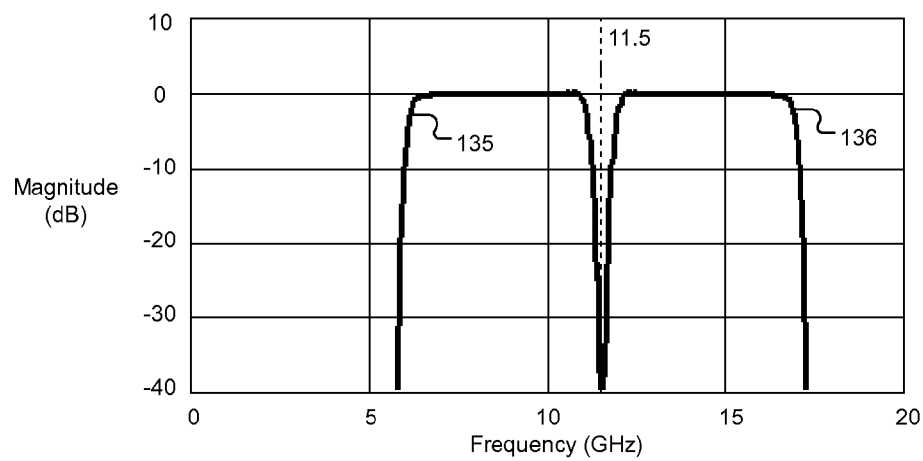
FIG. 18 is a graphical representation of the digitally mixed combination of the HF low image and the notch filter response.

Returning to the description of the HF path, and particularly the mixer [83] in FIG. 9, the digitally generated LO may be multiplied with the HF waveform applied to the mixer. This digital mixing action causes the input frequency band from 500 MHz to 5.5 GHz to produce two new images, as shown in FIG. 18. The band located from 6 to 11 GHz [135] contains the desired frequency content provided in the 500 MHz to 5.5 GHz range, but flipped in frequency. The frequency flipping action caused by the high bandwidth hardware due to the high-side downconversion has now been undone and the frequency band has been restored to its correct frequency band location. Another image is produced from 12 to 17 GHz [136] that is an undesired image in this embodiment. At this point, the rationale for upsampling in this embodiment can be seen—if the HF waveform had not been upsampled, the 12 to 17 GHz band [136] would be aliased into a band from 3 to 8 GHz. Upsampling allows this band to have a benign effect in this embodiment.

Figure 19:
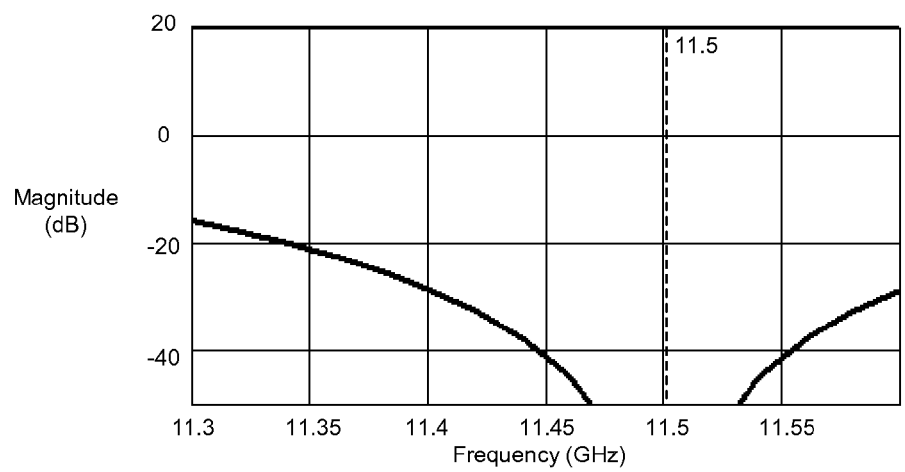
FIG. 19 is a graphical representation of the digitally mixed combination of the HF low image and the notch filter.

The region around 11.5 GHz should be examined to verify that the proper rejection of the input DC component has occurred. Referring to FIG. 19, it is seen that the component at 11.5 GHz has been attenuated by at least 50 dB.

Figure 20:
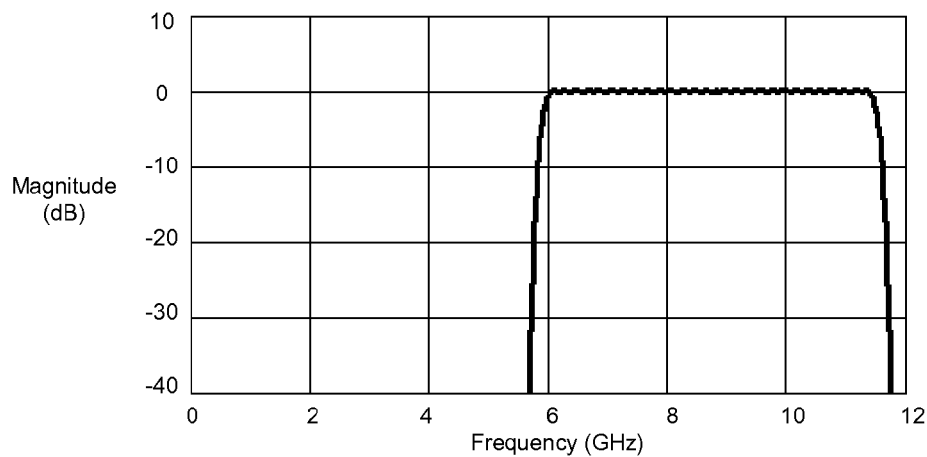
FIG. 20 is a graphical representation of the HF high image filter magnitude response.

The HF waveform proceeds from the digital mixer [83] to the HF high image filter [88]. This filter [88] may be built according to the high image filter specifications [115] shown in FIG. 10. It may be a symmetric FIR built utilizing frequency sampling methods. The specifications provide in the preferred embodiment 400 filter coefficients [116], a low cutoff at 5.8 GHz [117], a high cutoff at 11.5 GHz [118] and a transition band of 500 MHz [119]. Its response is shown in FIG. 20. The main purpose of this filter is to reject the image produced by the mixing action in the 12 to 17 GHz range [136] shown in FIG. 18.

Figure 21:
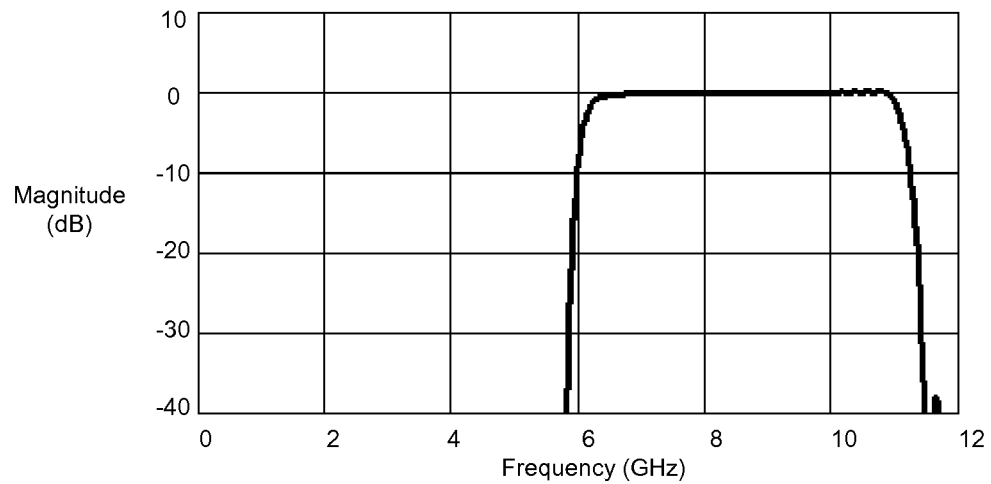
FIG. 21 is a graphical representation of the overall HF digital filter response.

The combination of all of the filters in the HF path is shown in FIG. 21. This represents the response of the digital system of the preferred embodiment to the HF input.

At this point, the processed LF and HF waveforms are almost ready for summing. The waveforms are preferably scaled before summing. The scaling of the HF waveform depends in this embodiment on the relationship of the high bandwidth channel vdiv setting (which is the same as the LF front-end vdiv setting) and the 50 mV/div range used to acquire the HF waveform. The HF waveform scaling is calculated:

$$HFGain = \frac{LFVdiv}{HFVdiv} \cdot 2 \qquad \text{Equation 2}$$

HF vdiv is, in this situation, a constant 50 mV/div and the factor of 2 accounts for the fact that each frequency band created by the mixing action is half size. While this factor could have been accounted for by doubling the size of the digital LO, the foregoing technique is preferred where processing is performed within the oscilloscope utilizing integer arithmetic which could cause an overflow.

After scaling the LF waveform using the LF gain element [76] and HF waveform using the HF gain element [89], the scaled waveforms may be combined by the summer [77] that adds them together. As noted above, phase shifts, amplitude variations, transport delays, phase responses, and other distortion characteristics of the transport paths have been taken into account in generation of the filter stages. Therefore, the combination of the signals in the two channels amounts to a summing of the compensated waveforms.

Rather than compensate the waveforms at this earlier stage, the compensation could be performed at the combining stage. Thus, a more complicated filter/summing stage could be employed that would perform the same two basic functions: compensating the signals for distortion characteristics generated by propagation through the transmission channels, and combining of the signals into a single waveform having the increased bandwidth.

Figure 22:
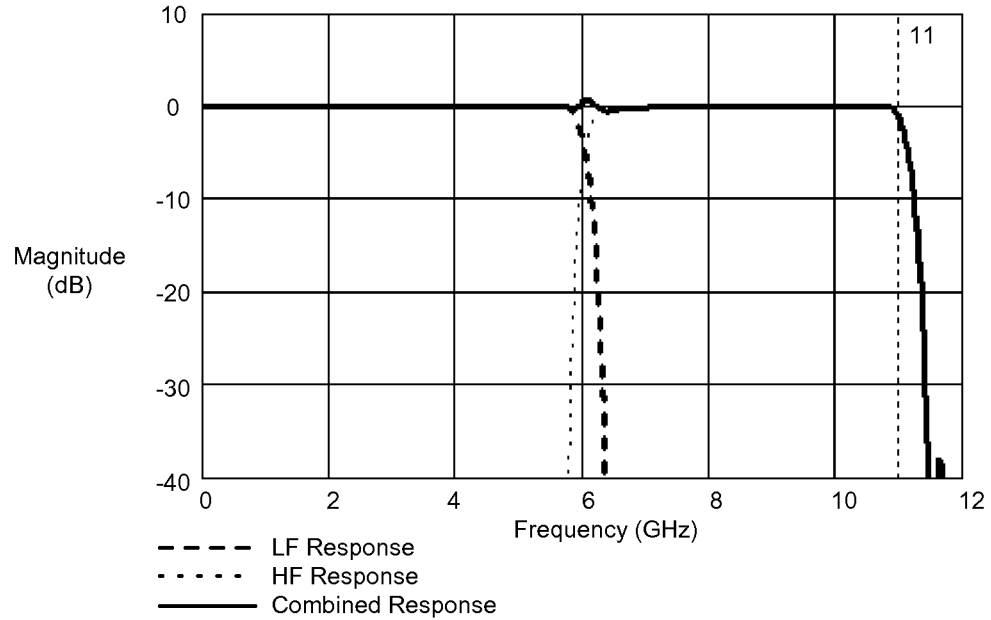
FIG. 22 is a graphical representation of a LF and HF path digital filter response.

The overall response of the digital system of the preferred embodiment as a result of this processing is shown in FIG. 22 where the LF and HF path response is shown along with the combined response. It can be seen that the digital processing preserves the 11 GHz bandwidth specification of this embodiment.

Figure 23:
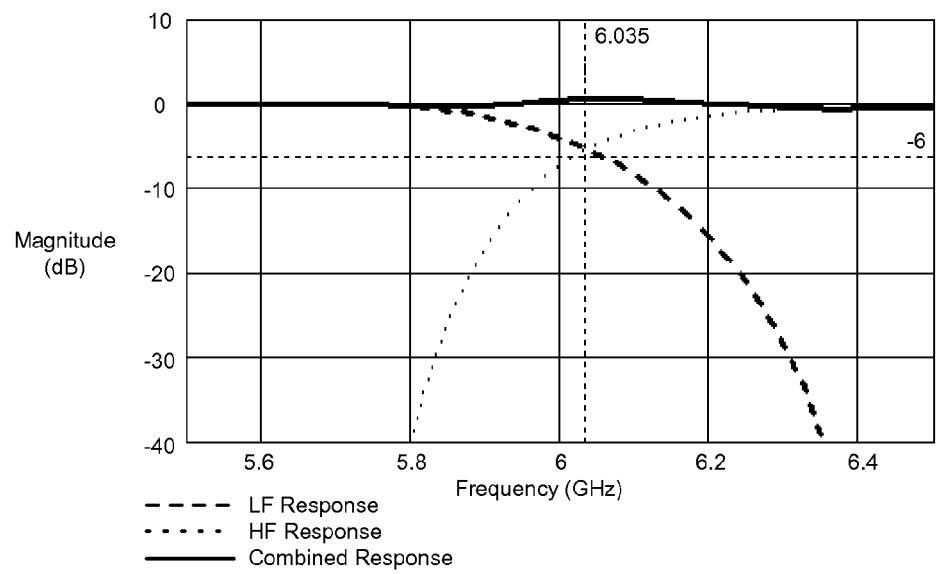
FIG. 23 is a graphical representation of a LF and HF path digital filter response.

FIG. 23 shows the result of the recombination in the crossover region in this embodiment. It can be seen that middle of the region occurs at 6.035 GHz and the response of each filter is approximately the desired −6 dB. The width of the region (defined as the region where the LF and HF band differs in strength from each other by less than 20 dB) encompasses the frequencies between approximately 5.85 GHz and 6.21 GHz, a band of approximately 360 MHz.

Figure 24:
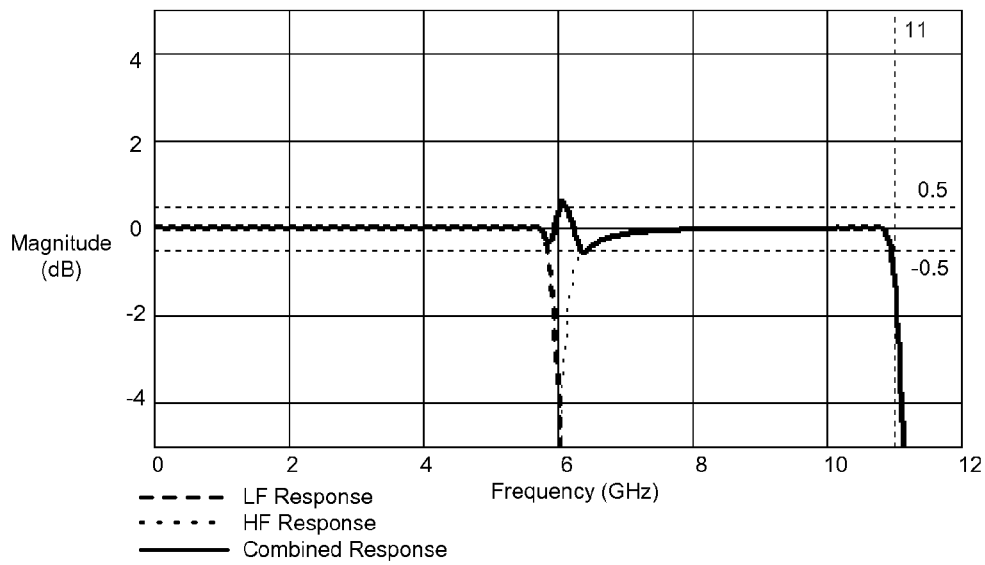
FIG. 24 is a graphical representation of a LF and HF path digital filter response.

FIG. 24 shows the non-flatness caused by the band combination. It is seen that the non-flatness is on the order of +/−0.5 dB. Further improvements may be made to the flatness of the resulting signal based on minor alterations of the filter specifications.

The result of the processing in FIG. 9 up to this point is to split the signal into two frequency bands, inject these two bands into two separate oscilloscope front-ends, acquire the waveforms, and digitally process the waveform to provide an 11 GHz waveform acquisition. The analog processing of these waveforms may lead to magnitude response and group delay non-flatness, which causes distortion in the frequency response and time domain response of the system. For this reason, techniques may be utilized to compensate the magnitude response and group delay to provide a good overall response at a magnitude and phase compensator 90. For example a signal processing system that compensates for a channel response characteristic of an input waveform may comprise input specifications, a filter builder, and a filter. The input specifications may be used to specify the design of the filter and include channel response characteristics defining the response characteristics of a channel used to acquire the input waveform, and user specifications for specifying a desired frequency response and a degree of compliance to the desired frequency response. The filter builder may generate coefficients for the filter and outputs final performance specifications. The filter may have a compensation filter generator for generating coefficients corresponding to a compensation response on the basis of the inverse of the channel response characteristics, and a response filter generator for generating coefficients corresponding to a combination of an ideal response and a noise reduction response on the basis of the user specifications. The filter filters the input waveform and may output an overall response waveform having a desired frequency response. The filter may further comprise a filter coefficient cache for storing the coefficients generated by the filter builder, a compensation filter portion for filtering the input waveform in accordance with the coefficients stored in the filter coefficient cache corresponding to the compensation response, and a response filter portion having a response filter stage and a noise reduction stage for filtering the compensated waveform output from said compensation filter portion that outputs the overall response waveform. The response filter portion may filter using the coefficients stored in the filter coefficient cache corresponding to the combination of the ideal response and the noise reduction response.

The final system output of the preferred embodiment is shown in FIG. 25, where an applied step with a rise time of 31 ps has been applied. The high bandwidth equipped oscilloscope acquired this waveform with a measured rise time of 51 ps, for an internal oscilloscope rise time of 40.5 ps, a rise time commensurate with an 11 GHz oscilloscope.

Therefore, in illustrative embodiments acquisition of a continuous time record wide-bandwidth signal is performed by a system employing multiple narrower bands, thereby making the best use of a system having physical characteristic limitations, such as bandwidth and sampling rate limitations. When the portions of the signal acquired by the multiple narrower bands are digitized, digitally processed, and recombined in a manner to minimize the effects of processing thereon, a digital output may be produced that is a substantially similar representation of the wideband input signal over substantially all of the bandwidth of the original signal.

While this detailed description makes reference to an 11 GHz oscilloscope as an example, the techniques described here are equally applicable to oscilloscopes or other devices employing signal acquisition, at any bandwidth.

The analog input signal is preferably received from a probe, either active or passive, in communicative contact with a device under test. The probe may optionally be a current probe or a differential probe.

Moreover, as mentioned above any number of component frequency bands may be derived from the input signal. Three, four, five or more bands may be derived from the input signal. The bands need not be adjacent or overlapping. In various embodiments, the bands are spaced apart and omit a portion of the input signal frequency band.

The down-conversion of the high frequency content need not be to the same frequency band as any low frequency band and the up-conversion need not be to the same frequency as any high frequency band. Any desired amount of frequency translation may be used. For instance, the translation may generate a signal occupying a frequency band overlapping but not substantially coincident with an adjacent frequency band.

The processing steps performed after acquisition or digitization can be aggregated or separated as desired. In one embodiment, all post-digitization processing steps are aggregated into a single digital processing element that outputs a digital representation of the analog input waveform. In other embodiments, subsets of the aforementioned digital processing steps, such as error tone removal and delay, are grouped into discrete digital processing elements.

Each of the digital processing elements may be built at inception or dynamically upon each acquisition. Where multiple discrete digital processing elements are used, some may be built at inception and others may be re-built each time a signal is acquired, as appropriate.

The down-conversion of the high frequency content can occur in the preferred embodiments at any point prior to digitization. Pre-digitization filtering and signal processing can be performed on the composite analog input signal before the signal is separated or the high frequency content is otherwise down-converted.

The periodic waveforms used in the frequency conversion techniques discussed herein need not be sinusoidal. Other periodic waveforms such as impulse trains and square waves may be utilized in certain embodiments.

Dynamic range, noise, distortion, crosstalk and input return loss (or VSWR) compensation are each optional. In various embodiments some or all of these compensations are omitted.

The digital representation of the analog input signal formed by recombining the two frequency bands may be output to downstream digital signal processing hardware to further filter or otherwise process the signal.

It will be understood by those skilled in the art that a signal of interest may not span the entire bandwidth of the analog input signal. In preferred embodiments, the entire input bandwidth is processed and digitized in the manner described even if a signal of interest (such as a clock signal of a system under test) occupies only a small fraction or a point of the system bandwidth.

Unless expressly stated otherwise the particular circuit topologies described herein are merely illustrative architectures suitable for particular preferred embodiments. For instance, the input signal need not be diplexed. Other approaches, such as passing the signal through a 50 ohm splitter and then through a bandpass filter may be utilized instead. Similarly, mixer isolation issues can be rejected with an image reject mixer or triple-balanced mixers. The notch filtering may be omitted where a different master clock is utilized. The LF content may be amplified or otherwise processed before being transmitted to the front end. The VGAs which provide a full-scale signal could be omitted and replaced with digital processing element(s) that compensate for noise. The same LO reference need not be used to generate both periodic functions for the up-conversion and down-conversion —fixed phase or spread spectrum techniques may be employed instead. The upsampling step is optional and may not be appropriate in various systems. For the sake of brevity, the remaining circuit elements will not be individually addressed here but it should be understood that various modifications to the particular topologies may be made within the context of this disclosure.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for digitizing an analog signal, comprising the steps of:
    separating an analog signal spanning a frequency range into a first signal occupying a first frequency band and a second signal occupying a second frequency band, at least a substantial portion of said second frequency band being higher than the first frequency band;
    translating the second signal to a lower frequency band;
    digitizing the translated second signal with digitizing elements having a frequency range less than the analog signal frequency range;
    digitizing the first signal; and
    forming a digital representation of the analog signal from the digitized first signal and the digitized second signal, the digital representation substantially spanning the frequency range of the analog signal.

2. The method of claim 1, wherein the analog signal is separated into three or more signals each occupying substantially separate frequency bands.

3. The method of claim 1, wherein the first frequency band and the second frequency band substantially overlap.

4. The method of claim 1, wherein the first frequency band and the second frequency band taken collectively omit a substantial portion of the analog input signal frequency range.

5. The method of claim 1, wherein the lower frequency band is substantially different from the first frequency band.

6. The method of claim 1, further comprising delaying the first signal relative to the second signal.

7. The method of claim 1, wherein forming comprises digitally mixing with a sinusoid.

8. The method of claim 1, further comprising filtering out an image of the translated second signal.

9. The method of claim 1, wherein the translated second signal in the lower frequency band is upsampled prior to the forming of the digital representation.

10. The method of claim 1, further comprising removing an error signal from the digital representation, the first signal, or the second signal.

11. The method of claim 1, further comprising correcting a phase of the first signal or the second signal.

12. The method of claim 1, further comprising removing an error signal from or correcting a phase of the first signal or the second signal during the forming of the digital representation.

13. The method of claim 1, wherein the digital representation is a substantially accurate representation of the analog input signal across substantially the entire frequency range.

14. The method of claim 1, further comprising outputting said digital representation to digital signal processing hardware in a digital oscilloscope.

15. The method of claim 1, wherein the analog signal is an input signal from a device under test.

16. The method of claim 1, wherein a signal of interest spans only a portion of the frequency range.

17. The method of claim 1, wherein translating comprises mixing with a first periodic function having a frequency.

18. The method of claim 17, wherein forming comprises digitally mixing with a second periodic function having substantially the same frequency as said first periodic function.

19. The method of claim 1, further comprising separating the analog input signal into a third signal occupying a third frequency band, at least a substantial portion of said third frequency band being higher than the second frequency band.

20. The method of claim 19, further comprising translating the third signal to substantially the same lower frequency band as the second signal.

21. The method of claim 1, wherein forming a digital representation of the analog signal from the digitized first signal and the digitized second signal comprises frequency converting said digitized second signal and combining the converted and digitized second signal with the digitized first signal.

22. The method of claim 21, further comprising frequency converting the digitized second signal substantially to the second frequency band signal prior to said combining.

23. The method of claim 21, wherein frequency converting comprises mixing with a periodic function.

24. The method of claim 23, wherein the periodic function is not sinusoidal.

25. The method of claim 1, further comprising generating a reference tone that carries phase information that is used to determine the phase of a first local oscillator with a constant offset, the first local oscillator being used to translate the second signal to the lower frequency band.

26. The method of claim 25, further comprising inserting the reference tone into the translated second signal.

27. The method of claim 25, further comprising inserting the reference tone into the first signal.

28. The method of claim 25, further comprising digitizing the reference tone.

29. The method of claim 28, further comprising generating a second local oscillator in accordance with the phase and constant offset.

30. The method of claim 29, further comprising using the second local oscillator to frequency convert the translated second signal substantially into the second frequency band.

31. A system for acquiring an analog signal, comprising:
    an analog input to receive an analog input signal spanning a frequency range, the frequency range including a first frequency band and a second frequency band higher than and substantially non-overlapping with said first frequency band;

a first signal path to transport a first signal occupying the first frequency band;

a second signal path to transport a second signal occupying the second frequency band;

a frequency translator to translate the second signal to a lower frequency band;

a digitizing system to digitize the first signal and second signal, the digitizing system having a frequency range less than the analog signal frequency range;

a second frequency translator for substantially restoring the digitized second signal to the second frequency band; and a digital combiner to join the first signal and the second signal and form a digital representation of the analog input signal, the digital representation substantially spanning the frequency range of the analog signal.

32. The system of claim 31, further comprising a delay element in the first signal path.

33. The system of claim 31, further comprising an image reject filter in the second signal path.

34. The system of claim 31, further comprising an upsampler in the second signal path.

35. The system of claim 31, further comprising a filter to remove an error signal in the first signal, second signal, or digital representation.

36. The system of claim 31, further comprising a phase correction system to modify the phase of the first signal or second signal in a crossover region where the first and second frequency bands overlap.

37. The system of claim 31, wherein the digital representation is a substantially accurate representation of the analog input signal across substantially the entire frequency range of the analog signal.

38. The system of claim 31, further comprising an output coupled to digital signal processing hardware in a digital oscilloscope.

39. The system of claim 31, further comprising a third parallel signal path to transmit a third signal occupying a third frequency band that is substantially above and substantially non-overlapping with the second frequency band.

40. The system of claim 31, wherein the first frequency band and the second frequency band taken collectively omit a substantial portion of a frequency range occupied by the analog input signal.

41. The system of claim 31, wherein the digital combiner receives the digitized second signal and a digitized version of the first signal.

42. The system of claim 31, wherein the first and second frequency bands span a predetermined substantially continuous frequency range.

43. The method of claim 31, wherein the digital representation substantially spans the predetermined substantially continuous frequency range.

44. The system of claim 31, further comprising a reference tone generator that generates a tone which carries phase information that is used to determine the phase of a first local oscillator with a constant offset used to translate the second signal to the lower frequency band.

45. The system of claim 44, further a second local oscillator to frequency convert the translated second signal substantially into the second frequency band.

46. The system of claim 31, wherein the frequency translator comprises a mixer coupled to an oscillator that generates a first periodic waveform.

47. The system of claim 46, wherein the second frequency translator comprises a digital mixer that receives a second periodic waveform.

48. The system of claim 47, wherein the frequencies of the first periodic waveform and the second periodic waveform are substantially the same.

49. A method for acquiring an analog signal by a digital acquisition system, comprising the steps of:

splitting a received analog signal into a plurality of frequency bands comprising a lower frequency band signal and at least one higher frequency band signal;

digitizing the lower frequency band signal;

interleave error correcting the digitized lower frequency band signal;

upsampling the corrected signal;

low pass filtering the upsampled signal; and crossover phase correcting the low pass filtered signal to generate a processed lower frequency band signal;

frequency converting the at least one higher frequency band signal to a translated lower frequency band signal so that a high frequency content thereof is translated from a higher frequency band to a translated lower frequency band;

generating a reference tone that carries the phase information required to determine the phase of a first local oscillator with a constant offset used to frequency convert the higher frequency band signal to the translated lower frequency band signal;

inserting the reference tone into the translated lower frequency band signal.

digitizing the translated lower frequency band signal and reference tone;

extracting the phase information used to determine the phase of the first local oscillator;

determining the phase of the first local oscillator with a constant offset;

generating a second local oscillator in accordance with the determined phase and constant offset;

interleave error correcting the digitized translated lower frequency band signal and reference tone higher frequency band signal;

upsampling the interleave error corrected signal;

low image filtering the upsampled signal to reject frequency content outside the higher frequency band of the higher frequency band signal;

notch filtering the low image filtered signal to remove the reference tone;

frequency converting the notch filtered signal in the translated lower frequency band back to a translated higher frequency band signal in the higher frequency band using the second local oscillator;

high image filtering the translated higher frequency band signal to remove any unwanted image information to generate a processed translated higher frequency band signal; and combining the processed lower frequency band signal and the processed translated higher frequency band signal into a substantially similar representation of the received analog signal over substantially all of the bandwidth of the received analog signal.

* * * * *